(12) United States Patent
Fujita et al.

(10) Patent No.: US 8,823,257 B2
(45) Date of Patent: Sep. 2, 2014

(54) LIGHT-EMITTING DEVICE, METHOD FOR MANUFACTURING THE SAME, DISPLAY DEVICE, AND ELECTRONIC APPARATUS

(75) Inventors: Tetsuji Fujita, Chino (JP); Etsuo Mitsuhashi, Chino (JP); Suguru Akagawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 535 days.

(21) Appl. No.: 12/778,598

(22) Filed: May 12, 2010

(65) Prior Publication Data
US 2010/0289417 A1 Nov. 18, 2010

(30) Foreign Application Priority Data
May 18, 2009 (JP) ................................. 2009-120358

(51) Int. Cl.
*H01J 1/62* (2006.01)
*H01J 63/04* (2006.01)
*H01J 9/24* (2006.01)
*H01L 51/50* (2006.01)
*H01L 27/32* (2006.01)
*H01L 51/52* (2006.01)

(52) U.S. Cl.
CPC ........ *H01L 51/5092* (2013.01); *H01L 27/3276* (2013.01); *H01L 51/5281* (2013.01); *H01L 51/5036* (2013.01); *H01L 27/3288* (2013.01); *H01L 51/5228* (2013.01)

USPC .............................................. 313/506; 445/24

(58) Field of Classification Search
USPC .................................................. 313/498–512
See application file for complete search history.

(56) References Cited

U.S. PATENT DOCUMENTS

2005/0012454 A1 * 1/2005 Yamazaki et al. ............ 313/506
2007/0241676 A1 10/2007 Park et al.

FOREIGN PATENT DOCUMENTS

| JP | A-2003-178880 | 6/2003 |
| JP | A-2007-287691 | 11/2007 |
| JP | A-2008-234990 | 10/2008 |

* cited by examiner

*Primary Examiner* — Anh Mai
*Assistant Examiner* — Zachary J Snyder
(74) *Attorney, Agent, or Firm* — Oliff PLC

(57) ABSTRACT

A light-emitting device is provided which includes: a cathode; an anode; at least one light-emitting layer which is provided between the cathode and the anode and which emits light when a voltage is applied between the cathode and the anode; a cathode terminal which is provided at a portion not in contact with the anode and the light-emitting layer and which supplies electrons to the cathode; and an electron adjust layer which includes a material having insulating properties and which adjusts the amount of electrons supplied from the cathode terminal to the cathode, and in the light-emitting device described above, the cathode is connected to the cathode terminal with the electron adjust layer interposed therebetween.

16 Claims, 10 Drawing Sheets

LIGHT-EMITTING DEVICE, METHOD FOR MANUFACTURING THE SAME, DISPLAY DEVICE, AND ELECTRONIC APPARATUS

BACKGROUND

1. Technical Field

The present invention relates to a light-emitting device, a method for manufacturing the same, a display device, and an electronic apparatus.

2. Related Art

An organic electroluminescent element (so-called organic EL element) is a light-emitting element having the structure in which at least one organic light-emitting layer is provided between an anode and a cathode. In the light-emitting element as described above, when an electric field is applied between the anode and the cathode, electrons and holes are simultaneously injected from a cathode side and an anode side, respectively, into the light-emitting layer, and since the electrons and the holes are recombined in the light-emitting layer, excitons are generated. When the excitons thus generated are returned to the ground state, the energy generated thereby is released in the form of light.

As the light-emitting element described above, for example, an element emitting white light has been known in which three light-emitting layers corresponding to three colors of R (red), G (green), and G (green) are laminated between a cathode and an anode (see, for example, JP-A-2007-287691). The light-emitting element emitting white light as described above may be used for a light-emitting device (such as a backlight) of a lighting device or a display device. In particular, when the light-emitting device described above and a color filter in which three colors of R (red), G (green), and G (green) are separately provided in each pixel are used in combination, a full-color image can be displayed.

Incidentally, in a light-emitting device including the light-emitting element as described above, in general, a drive voltage is applied to the light-emitting element through a drive transistor functioning as a switching element. That is, since a constant drive voltage is always applied between the cathode (or the anode) and the drive transistor, when the drive transistor electrically connects between the anode (or the cathode) and a power source, the drive voltage is applied between the anode and the cathode of the light-emitting element, so that light is emitted therefrom. On the other hand, it is configured that when the drive transistor does not connect between the power source and the anode (or the cathode), the drive voltage is not applied between the anode and the cathode of the light-emitting element, and no light is emitted therefrom.

However, even when the drive transistor does not connect between the power source and the anode (or the cathode), a minute voltage is applied between the cathode and the anode. When the minute voltage as described above is applied, the light-emitting element as disclosed in JP-A-2007-287691 slightly emits light. When the above phenomenon (black floating phenomenon) occurs in which light is slightly emitted although light emission is inhibited, for example, in a display device including a light-emitting device, the contrast ratio of a displayed image cannot be disadvantageously increased. In particular, when a light-emitting element which emits white light and a color filter are used in combination, if the black floating phenomenon described above occurs, light emission balance between individual light-emitting layers is made different from that obtained when a drive voltage is applied, and there has been a problem in that the light-emitting element slightly emits light having a color different from that originally designed. In addition, in particular, when the light emission balance between the individual light-emitting layers is changed, a color (such as a red color) which is relatively easily emitted tends to be primarily emitted.

SUMMARY

An advantage of some aspects of the invention is to provide a light-emitting device in which the black floating phenomenon is suppressed; a method for manufacturing a light-emitting device which can efficiently manufacture the above light-emitting device; and a display device and an electronic apparatus, each of which includes the above light-emitting device and which can display a high-quality image.

The advantages as described above can be achieved by the invention described below.

According to a first aspect of the invention, there is provided a light-emitting device which includes: a cathode; an anode; at least one light-emitting layer which is provided between the cathode and the anode and which emits light when a voltage is applied between the cathode and the anode; a cathode terminal which is provided at a portion not in contact with the anode and the light-emitting layer and which supplies electrons to the cathode; and an electron adjust layer which includes a material having insulating properties and which adjusts the amount of electrons supplied from the cathode terminal to the cathode, and in the light-emitting device described above, the cathode is connected to the cathode terminal with the electron adjust layer interposed therebetween.

Accordingly, a light-emitting device in which the black floating phenomenon is suppressed can be provided.

In the light-emitting device according to the first aspect of the invention, the cathode terminal and the electron adjust layer are preferably at least partially overlapped with each other in a thickness direction of the electron adjust layer.

Accordingly, the electron adjust layer can more reliably receive electrons from the cathode terminal and also can adjust the amount of electrons to be supplied to the cathode, so that the black floating phenomenon can be prevented, and in addition, when light is emitted, electrons can be preferably supplied to the cathode.

The light-emitting device according to the first aspect of the invention preferably further includes an auxiliary cathode which is disposed to be overlapped with at least part of the cathode terminal and at least part of the cathode in a thickness direction of the cathode and which includes a material having a higher electrical conductivity than that of the cathode.

Accordingly, the drive voltage of the entire light-emitting device can be made relatively low. As a result, when the application of voltage between the cathode and anode is stopped, a voltage applied between the cathode terminal and the anode is further decreased, and hence the black floating phenomenon can be preferably prevented.

In the light-emitting device according to the first aspect of the invention, the auxiliary cathode is preferably disposed in contact with the cathode.

Accordingly, the auxiliary cathode can more efficiently assist transportation of electrons of the cathode, and the drive voltage of the light-emitting device can be further decreased.

The light-emitting device according to the first aspect of the invention preferably further includes: a power source for applying a voltage to the cathode through the cathode terminal and to the anode; and an electron injection layer which is provided between the cathode and the light-emitting layer to be overlapped with at least part of the cathode and at least part of the light-emitting layer in a thickness direction of the cathode and which promotes injection of electrons supplied from the cathode into the light-emitting layer, and the electron injection layer and the electron adjust layer preferably includes the same material.

Accordingly, even when part of the electron adjust layer does not function as the electron injection layer, the electron injection layer and the electron adjust layer can be simultaneously formed.

In the light-emitting device according to the first aspect of the invention, the electron adjust layer is preferably provided to be overlapped in a thickness direction thereof with the light-emitting layer and also preferably functions as the electron injection layer of the light-emitting device.

Accordingly, since the electron adjust layer and the electron injection layer collectively and simultaneously formed, the light-emitting device can be efficiently manufactured.

The light-emitting device according to the first aspect of the invention preferably further includes: a power source for applying a voltage to the cathode through the cathode terminal and to the anode; and a switching element which controls the intensity of a voltage from the power source to be applied to the cathode terminal and the anode, and when the switching element is operated to stop the application of the voltage from the power source to the cathode and the anode, the electron adjust layer preferably has certain insulating properties so as to prevent movement of electrons from the cathode terminal to the cathode.

Accordingly, the black floating phenomenon can be preferably prevented.

The light-emitting device according to the first aspect of the invention preferably further includes: a power source for applying a voltage to the cathode through the cathode terminal and to the anode, and a switching element which controls the intensity of a voltage from the power source to be applied to the cathode terminal and the anode, and when the switching element is operated to apply the voltage from the power source to the cathode and the anode, the electron adjust layer preferably has certain insulating properties so as not to prevent movement of electrons from the cathode terminal to the cathode.

Accordingly, while the black floating phenomenon is prevented, when the light-emitting device is made to emit light, electrons are efficiently supplied from the cathode terminal to the cathode, and the light-emitting device preferably emits light.

In the light-emitting device according to the first aspect of the invention, the electron adjust layer preferably includes at least one of a ferroelectric material, an alkali metal oxide, an alkali metal halide, an alkaline earth metal oxide, and an alkaline earth metal halide.

The materials mentioned above each have sufficiently high insulating properties, and in addition, when being formed into a thin film, the materials enable electrons to pass therethrough by the Hall effect when a drive voltage is applied. That is, the generation of the black floating phenomenon is preferably suppressed, and in addition, when the drive voltage is applied, the light-emitting device preferably emits light.

In the light-emitting device according to the first aspect of the invention, the electron adjust layer preferably includes a lithium compound.

The material mentioned above has sufficiently high insulating properties, and in addition, when being formed into a thin film, the material enables electrons to pass therethrough by the Hall effect when a drive voltage is applied. That is, the generation of the black floating phenomenon is preferably suppressed, and in addition, when the drive voltage is applied, the light-emitting device preferably emits light.

In the light-emitting device according to the first aspect of the invention, the light-emitting layers are preferably provided between the cathode and the anode.

In general, in a light-emitting device having a plurality of light-emitting layers, since the drive voltage tends to increase, the voltage output from a power source is liable to become high, and as a result, the black floating phenomenon is liable to occur. However, according to the first aspect of the invention, since the electron adjust layer is provided, although the light-emitting device has a plurality of the light-emitting layers, the black floating phenomenon can be preferably prevented.

In the light-emitting device according to the first aspect of the invention, the light-emitting layers preferably emit different colors from each other.

Heretofore, when the black floating phenomenon is generated, among a plurality of light-emitting layers, a light-emitting layer which emits light having a longer wavelength tends to emit light, and in the black floating phenomenon, a color different from a desired color may be emitted from the light-emitting device in some cases. In particular, as the entire light-emitting device, when white light is emitted as a whole from the light-emitting layers, the problem as described above becomes more serious. However, according to the invention, since the black floating phenomenon itself is prevented, the problem as described above can be prevented.

A method for manufacturing a light-emitting device according to a second aspect of the invention includes: forming an anode and a cathode terminal on a substrate; forming a light-emitting layer on the anode which emits light when a voltage is applied; forming an electron adjust layer which includes a material having insulating properties and which overlaps the light-emitting layer and the cathode terminal in plan view; and forming a cathode on the electron adjust layer, and the electron adjust layer functions to adjust the amount of electrons supplied from the cathode terminal to the cathode and is partially configured to function as an electron injection layer which promotes injection of electrons from the cathode into the light-emitting layer.

Accordingly, a method capable of efficiently manufacturing a light-emitting device which suppresses the black floating phenomenon can be provided.

A display device according to a third aspect of the invention includes the light-emitting device according to the first aspect of the invention.

Accordingly, a display device can be provided which prevents the black floating phenomenon and which can display a high-quality image.

An electronic apparatus according to a fourth aspect of the invention includes the display device according to the third aspect of the invention.

Accordingly, an electronic apparatus can be provided which prevents the black floating phenomenon and which can display a high-quality image.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferable embodiments of a light-emitting device, a display device, and an electronic apparatus of the invention will be described with reference to the accompanying drawings.

Figure 1:
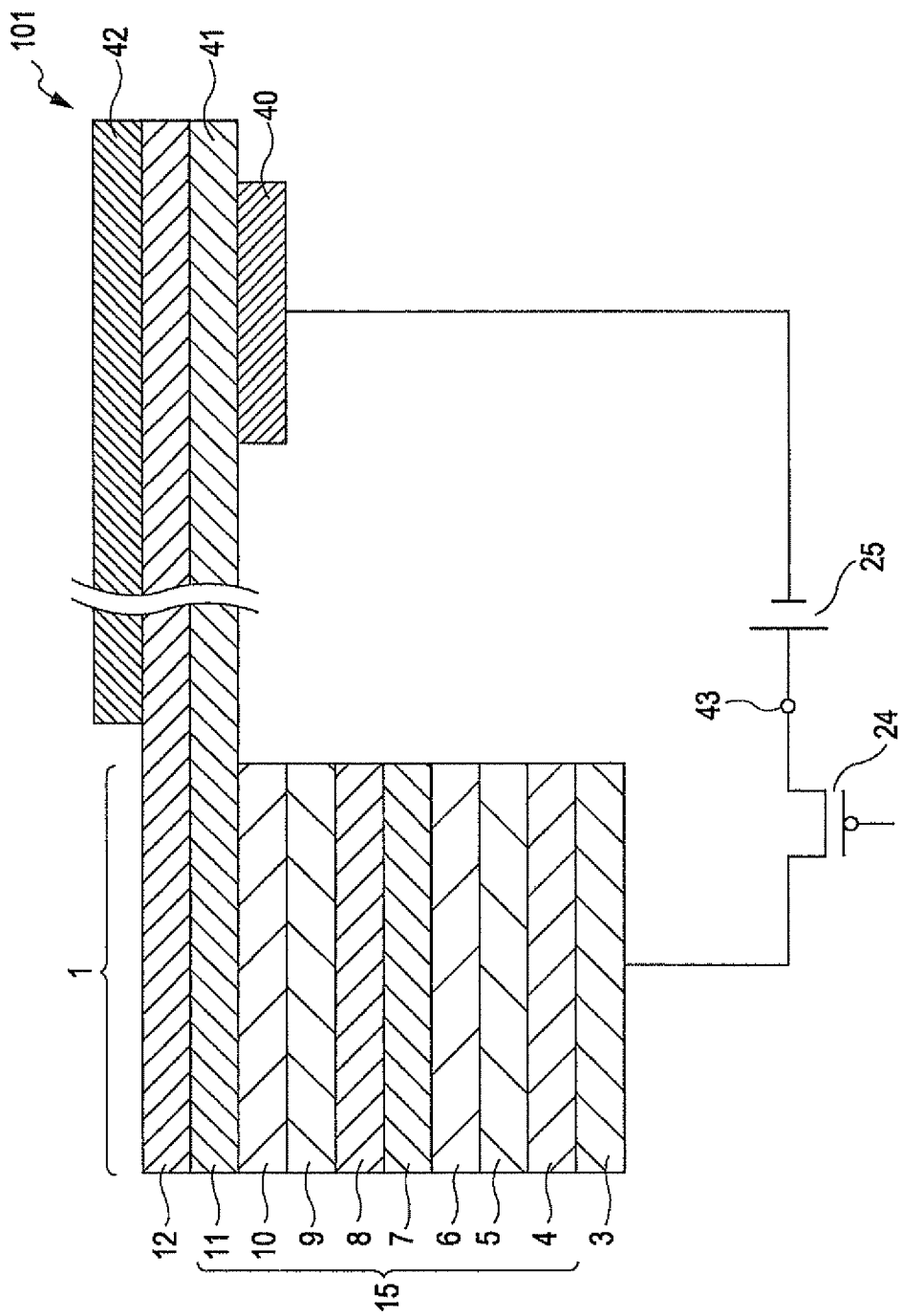
FIG. 1 is a vertical cross-sectional view schematically showing a preferable embodiment of a light-emitting device of the invention.
Figure 2:
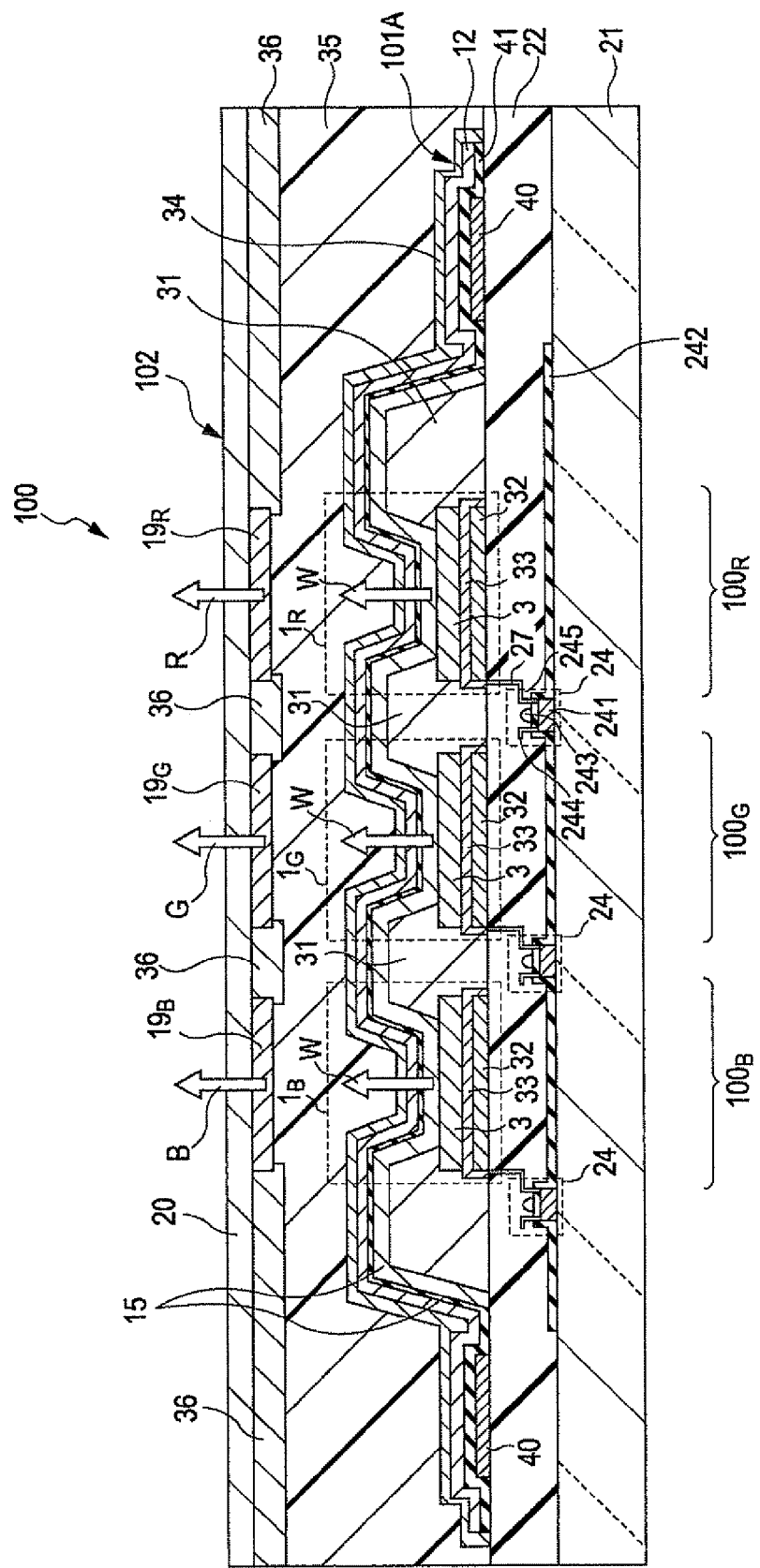
FIG. 2 is a schematic cross-sectional view showing one example of a display device of the invention.
Figure 3:
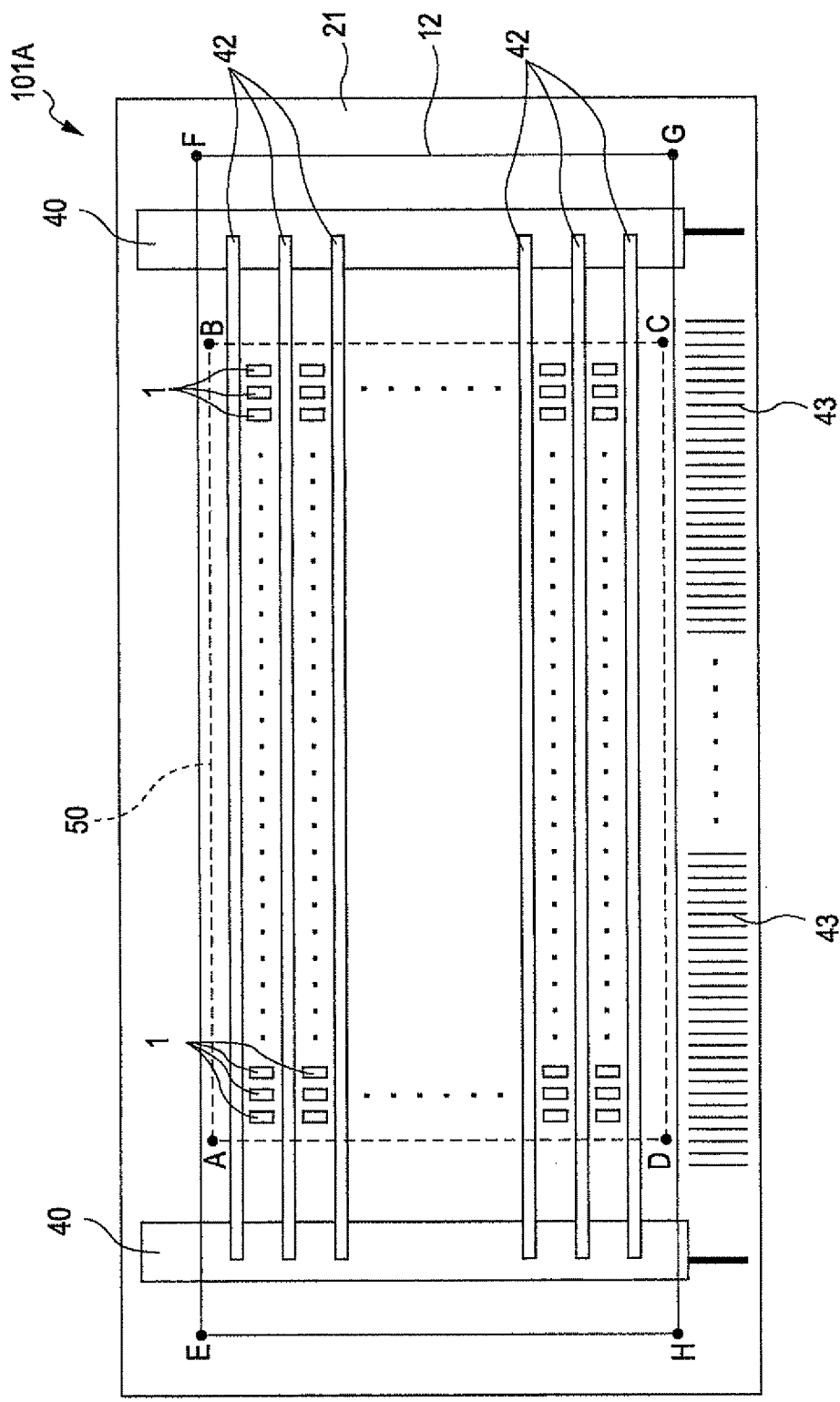
FIG. 3 is a schematic plan view showing a light-emitting device of the display device shown in FIG. 2.

FIG. 1 is a vertical cross-sectional view schematically showing a preferable embodiment of a light-emitting device of the invention; FIG. 2 is a schematic cross-sectional view showing one example of a display device of the invention; and FIG. 3 is a schematic plan view sowing a light-emitting device of the display device shown in FIG. 2. In addition, hereinafter, for the convenience of illustration, an upper side and a lower side in each of FIGS. 1 to 3 are called "top" and "bottom", respectively.

A light-emitting device 101 shown in FIG. 1 includes a light-emitting element 1, a cathode terminal (cathode contact) 40, an electron adjust layer 41, an auxiliary cathode 42, an anode terminal (anode contact) 43, a switching element 24, and a power source 25.

The light-emitting element (organic electroluminescent element) 1 emits light of R (red), G (green), and B (blue), so that white light emission is performed.

In addition, the light-emitting element 1 is a laminate in which an anode 3, a hole injection layer 4, a hole transport layer 5, a red-light-emitting layer (first light-emitting layer) 6, an interlayer 7, a blue-light-emitting layer (second light-emitting layer) 8, a green-light-emitting layer (third light-emitting layer) 9, an electron transport layer 10, an electron injection layer 11, and a cathode 12 are laminated in that order.

In other words, the light-emitting element 1 is formed of the individual layers and electrodes, each of which has a film shape, and has the structure in which a laminate 15 which includes the hole injection layer 4, the hole transport layer 5, the red-light-emitting layer 6, the interlayer 7, the blue-light-emitting layer 8, the green-light-emitting layer 9, the electron transport layer 10, and the electron injection layer 11 is provided between the two electrodes (the anode 3 and the cathode 12).

In the light-emitting element 1 described above, when a drive voltage is applied from the power source 25 to the anode 3 and the cathode 12, electrons are supplied (injected) from a cathode 12 side to the individual light-emitting layers, that is, the red-light-emitting layer 6, the blue-light-emitting layer 8, and the green-light-emitting layer 9, and at the same time, holes are supplied (injected) thereto from an anode 3 side. Subsequently, since holes and electrons are recombined in each of the light-emitting layers, excitons are generated by energy released when this recombination occurs, and when the excitons are returned to the ground state, energy (fluorescence or phosphorescence) is released (light emission). As a result, the light-emitting element 1 performs white light emission.

In addition, the cathode 12 having a film shape is extended from the light-emitting element 1, and a part of the extended portion is overlapped with the cathode terminal 40 and the electron adjust layer 41, each of which will be described later, to form a layer.

Furthermore, the entire light-emitting device 101 other than the power source 25 is provided on a substrate (not shown) and is also sealed by a sealing member (not shown).

The substrate functions to support the anode terminal 43, the cathode terminal 40, and the like. Since the light-emitting element 1 of this embodiment is configured to take light from a sealing member side (side opposite to the substrate, the top side in FIG. 1) (top emission type), the substrate and the anode 3 are not required to have optical transparency.

As the substrate, for example, a substantially transparent (colorless transparent, colored transparent, or semi-transparent) substrate or an opaque substrate may be mentioned.

When the substrate is a transparent substrate, as a constituent material therefor, for example, a resin material, such as a poly(ethylene terephthalate), a poly(ethylene naphthalate), a polypropylene, a cycloolefin polymer, a polyamide, a poly(ether sulfone), a poly(methyl methacrylate), a polycarbonate, or a polyarylate, or a glass material, such as quartz glass or soda glass, may be mentioned, and the above materials may be used alone or in combination of at least two thereof.

As the opaque substrate, for example, a substrate formed from a ceramic material such as alumina, a metal substrate, such as stainless steel, provided with an oxide film (insulating film) on a surface thereof, or a substrate formed from a resin material may be mentioned.

Although the average thickness of the substrate mentioned above is not particularly limited, the thickness is preferably 0.1 to 30 mm and more preferably 0.1 to 10 mm.

In addition, in the case in which the light-emitting element 1 is configured to take light from a substrate side (bottom emission type), since the substrate is required to have optical transparency, the transparent substrates mentioned above may be used as the substrate.

Furthermore, the substrate may also be provided with an electronic circuit layer having an electronic circuit which includes, for example, wires from the power source to the anode terminal 43 and the cathode terminal 40 and the switching element 24 which will be described later.

Next, the individual portions of the light-emitting device 101 will be described.

Anode

The anode 3 is an electrode which injects holes into the hole transport layer 5 through the hole injection layer 4 which will be described later. As a constituent material for this anode 3, a material having a large work function and a superior electrical conductivity is preferably used.

As the constituent material for the anode 3, for example, an oxide, such as ITO (indium tin oxide), IZO (indium zinc oxide), $In_2O_3$, $SnO_2$, $SnO_2$ containing Sb, or ZnO containing Al, or a metal, such as Au, Pt, Ag, Cu or an alloy thereof, may be mentioned, and the above materials may be used alone or in combination of at least two thereof.

Although the average thickness of the anode 3 described above is not particularly limited, the thickness is preferably 10 to 200 nm and more preferably 20 to 100 nm.

Cathode

The cathode 12 is an electrode which injects electrons into the electron transport layer 10 through the electron injection layer 11 which will be described later.

As a constituent material for this cathode 12, a material having a small work function is preferably used.

As the constituent material for the cathode 12, for example, Li, Mg, Ca, Sr, La, Ce, Er, Eu, Sc, Y, Yb, Ag, Cu, Al, Cs, Rb, or an alloy thereof may be mentioned, and the above materials may be used alone or in combination of at least two thereof (for example, a laminate including a plurality of layers).

In particular, when an alloy is used as the constituent material for the cathode 12, an alloy containing a stable metal element, such as Ag, Al, or Cu, and in particular, an alloy, such as MgAg, AlLi, or CuLi, is preferably used. As the constituent material for the cathode 12, when the alloy mentioned above is used, electron injection efficiency and stability of the cathode 12 can be improved. In addition, in the case described above, the content of a stable metal element, such as Ag, Al, or Cu, in the alloy is preferably 1.0 to 30 percent by weight and more preferably 3.0 to 20 percent by weight. Accordingly, the effects as described above can be more significantly obtained.

In addition, since the light-emitting element 1 is a top emission type, the cathode 12 is required to have optical transparency and is formed to have an average thickness which enables light to transmit therethrough.

Although the average thickness of the cathode 12 described above is not particularly limited, the thickness is preferably 0.1 to 1,000 nm and more preferably 0.5 to 500 nm.

In particular, in the case of a top emission type, the thickness is preferably 0.5 to 10 nm and most preferably 0.5 to 5 nm.

In addition, in particular, in the case of a bottom emission type, the thickness is preferably 10 to 500 nm and most preferably 50 to 300 nm.

Hole Injection Layer

The hole injection layer 4 has a function to improve hole injection efficiency from the anode 3.

Although a constituent material (hole injection material) for this hole injection layer 4 is not particularly limited, for example, there may be mentioned copper phthalocyanine, 4,4',4"-tris(N,N-phenyl-3-methylphenylamino)triphenylamine (m-MTDATA), or N,N'-bis-(4-diphenylamino-phenyl)-N,N'-diphenyl-biphenyl-4,4'-diamine shown by the following chemical formula 1.

Chemical Formula 1

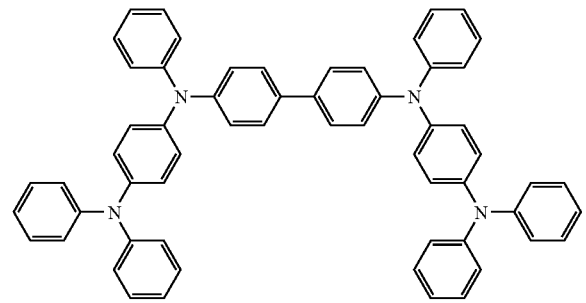

Although the average thickness of the hole injection layer 4 described above is not particularly limited, the thickness is preferably 5 to 150 nm and more preferably 10 to 100 nm.

In addition, one of this hole injection layer 4 and the hole transport layer 5 which will be described below may be omitted.

Hole Transport Layer

The hole transport layer 5 has a function to transport holes injected from the anode 3 through the hole injection layer 4 to the red-light-emitting layer 6.

As a constituent material for this hole transport layer 5, various p-type high molecular weight materials and various p-type low molecular weight materials may be used alone or in combination, and for example, tetraarylbenzidine derivatives, such as N,N,N',N'-tetrakis-biphenyl-3-yl-biphenyl-4,4'-diamine shown by the following chemical formula 2, N,N'-bis(1-naphthyl)-N,N'-diphenyl[1,1'-biphenyl]-4,4'-diamine (α-NPD), and N,N'-diphenyl-N,N'-bis(3-methylphenyl)-1,1'-diphenyl-4,4'-diamine (TPD), tetraaryldiaminofluorene compounds and derivatives thereof (amine compounds) may be mentioned and may be used alone or in combination of at least two of the above materials.

Chemical Formula 2

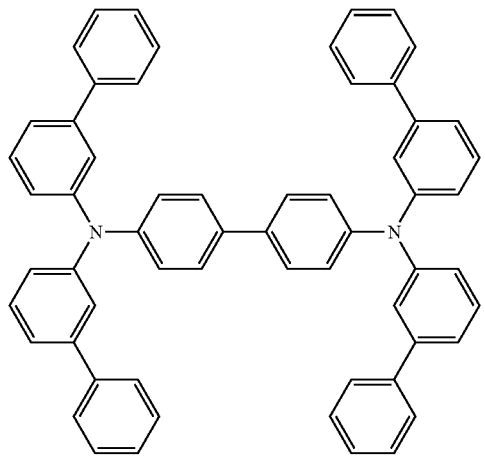

Although the average thickness of the hole transport layer 5 described above is not particularly limited, the thickness is preferably 10 to 150 nm and more preferably 10 to 100 nm.

In addition, one of this hole transport layer 5 and the hole injection layer 4 described above may be omitted.

Red-Light-Emitting Layer

This red-light-emitting layer (first light-emitting layer) 6 includes a first light-emitting material which emits a red color (first color).

Since light having a relatively long wavelength is used as the first color as described above, a light-emitting material may be used which has a relatively small energy level difference (band gap) between the lowest unoccupied molecular orbit (LUMO) and the highest occupied molecular orbit (HOMO). The light-emitting material having a relatively small band gap as described above is likely to trap holes or electrons and is likely to emit light. Accordingly, since the red-light-emitting layer 6 is provided at the anode 3 side, the blue-light-emitting layer 8 and the green-light-emitting layer 9, each of which has a large band gap and which is not likely to emit light, are provided at the cathode 12 side, and hence light emissions from the individual light-emitting layers can be well balanced.

The red-light-emitting material as described above is not particularly limited, and various red fluorescent materials and various red phosphorescent materials may be used alone or in combination of at least two thereof.

As the red fluorescent material, any material may be used as long as it emits red fluorescence, and for example, there may be mentioned perylene derivatives, such as a dibenzotetraphenyldiindenoperylene derivative shown by the following chemical formula 3, europium complexes, benzopyran derivatives, rhodamine derivatives, benzothioxanthene derivatives, porphyrin derivatives, Nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene) propanedinitrile (DCJTB), and 4-(dicyanomethylene)-2-methyl-6-(p-dimethylaminostyryl)-4H-pyran (DCM).

Chemical Formula 3

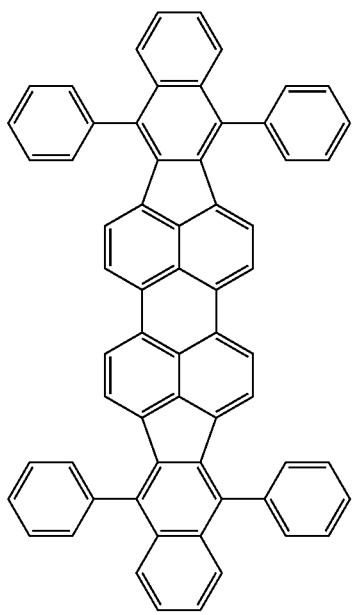

As the red phosphorescent material, although any material may be used as long as it emits red phosphorescence, for example, metal complexes of iridium, ruthenium, platinum, osmium, rhenium, palladium, or the like may be mentioned, and at least one ligand of each of the above metal complexes preferably has a phenylpyridine skeleton, a bipyridyl skeleton, a porphyrin skeleton, or the like. In more particular, for example, there may be mentioned tris(1-phenylisoquinoline) iridium, bis[2-(2'-benzo[4,5-α]thienyl)pyridinate-N,C3']iridium(acetylacetonate) (btp2Ir(acac)), 2,3,7,8,12,13,17,18-octaethyl-12H,23H-porphyrin-platinum(II), bis[2-(2'-benzo [4,5-α]thienyl)pyridinate-N,C3']iridium, and bis(2-phenylpyridine)iridium(acetylacetonate).

In addition, as a constituent material for the red-light-emitting layer 6, in combination with at least one of the red-light-emitting materials mentioned above which is used as a guest material, a host material (first host material) may be used. This host material has functions of recombining holes and electrons to generate excitons, transferring energy of the excitons to the red-light-emitting material (Forster transfer or Dexter transfer), and exciting the red-light-emitting material. In order to use the first host material described above, for example, the first host material may be doped with a red-light-emitting material, which is a guest material, as a dopant.

As the first host material described above, any material may be used as long as it has the above-described functions to a red-light-emitting material to be used; however, when the red-light-emitting material includes a red fluorescent material, for example, there may be mentioned distyrylarylene derivatives, naphthacene derivatives, anthracene derivatives, such as that shown by the following chemical formula 4 and 2-t-butyl-9,10-di(2-naphthyl)anthracene (TBADN), perylene derivatives, distyrylbenzene derivatives, distyrylamine derivatives, quinolinolato metal complexes such as tris(8-quinolinolato)aluminum complex ($Alq_3$), triarylamine derivatives such as triphenylamine tetramer, oxadiazole derivatives, tetracene and its derivatives, such as that shown by the following chemical formula 5, silole derivatives, dicarbazole derivatives, oligothiophene derivatives, benzopyran derivatives, triazole derivatives, benzoxazole derivatives, benzothiazole derivatives, quinoline derivatives, and 4,4'-bis (2,2'-diphenylvinyl)biphenyl (DPVBi). These materials may be used alone or in combination of at least two thereof.

In addition, when the red-light-emitting material includes a red phosphorescent material, as the first host material, for example, carbazole derivatives, such as 3-phenyl-4-(1'-naphtyl)-5-phenylcarbazole and 4,4-N,N'-dicarbazolebiphenyl (CBP), may be mentioned, and these materials may be used alone or in combination of at least two thereof.

Chemical Formula 4

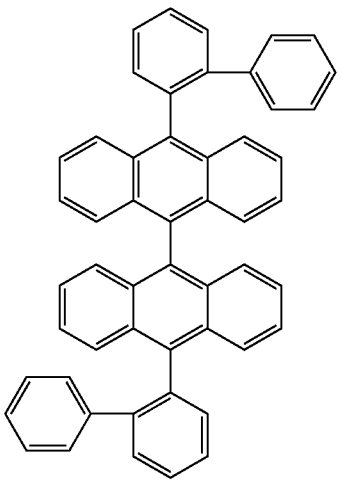

Chemical Formula 5

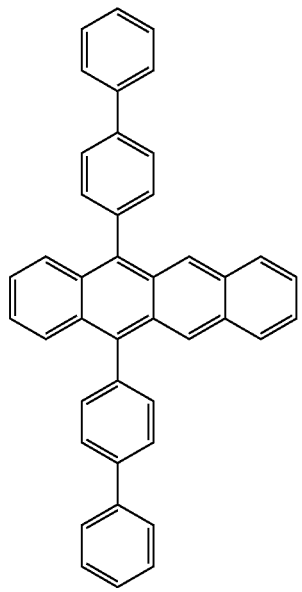

When the first host material is contained in the red-light-emitting layer 6, the content (dosage) of the red-light-emitting material in the red-light-emitting layer 6 is preferably 0.01 to 10 percent by weight and more preferably 0.1 to 5 percent by weight. When the content of the red-light-emitting material is set in the range described above, the light emission efficiency can be optimized, and while the light emission amount of the blue-light-emitting layer 8 and that of the green-light-emitting layer 9, each of which will be described later, are balanced, the red-light-emitting layer 6 can be made to emit light.

In addition, although the average thickness of the red-light-emitting layer 6 is not particularly limited, the thickness is preferably 3 to 30 nm and more preferably 5 to 20 nm. Accordingly, the light emissions from the individual light-emitting layers of the light-emitting element 1 can be well balanced.

Interlayer

The interlayer 7 is provided between the above-described red-light-emitting layer 6 and the blue-light-emitting layer 8 which will be described later so as to be in contact with both of them. In addition, the interlayer 7 functions to adjust the amount of electrons which are transported from the blue-light-emitting layer 8 to the red-light-emitting layer 6. In addition, the interlayer 7 functions to adjust the amount of holes which are transported from the red-light-emitting layer 6 to the blue-light-emitting layer 8. Furthermore, the interlayer 7 also functions to inhibit movement of energy of excitons between the red-light-emitting layer 6 and the blue-light-emitting layer 8. By the functions described above, the red-light-emitting layer 6 and the blue-light-emitting layer 8 are both made to efficiently emit light. As a result, the light emissions from the individual light-emitting layers can be well balanced, the light-emitting element 1 can emit a desired color (white color in this embodiment), and the light emission efficiency and light emission life can be improved.

As a constituent material for the interlayer 7 described above, any material may be used as long as it can enable the interlayer 7 to have the functions described above, and for example, a material having a function of transporting holes (hole transport material) or a material having a function of transporting electrons (electron transport material) may be used. In particular, a material having a function of transporting holes is preferable.

In general, although the mobility of holes is low as compared to that of electrons, when the interlayer 7 includes a hole transport material, holes are smoothly transferred from the interlayer 7 to the blue-light-emitting layer 8, and the individual light-emitting layers are likely to emit light with good balance; hence, the light-emitting element 1 can more reliably emit a desired color (white color) and can also achieve superior light emission efficiency.

As a hole transport material used for the interlayer 7 described above, any material may be used as long as it enables the interlayer 7 to have the functions described above, and for example, although amine-based materials having an amine skeleton among the aforementioned hole transport materials may be used, benzidine-based amine derivatives are preferably used.

In particular, among the benzidine-based amine derivatives, as an amine-based material used for the interlayer 7, a material having at least two aromatic ring groups is preferable, and a tetraaryl benzidine derivative is more preferable. As the benzidine-based amine derivative, for example, the compound shown by the above chemical formula 2, N,N'-bis(1-naphthyl)-N,N'-diphenyl[1,1'-biphenyl]-4,4'-diamine (α-NPD), and N,N,N',N'-tetranaphthyl-benzidine (TNB) may be mentioned.

The amine-based materials mentioned above have superior hole transport properties. Hence, holes can be smoothly transferred from the red-light-emitting layer 6 to the blue-light-emitting layer 8 through the interlayer 7. In addition, since holes are sufficiently supplied to the blue-light-emitting layer 8 which is most unlikely to emit light among the individual light-emitting layers, even if the voltage applied between the anode 3 and the cathode 12 is changed, the light emission balance between the individual light-emitting layers is not likely to change.

In addition, as the constituent material for the interlayer 7, in particular, an electron transport material is preferably contained together with the hole transport material. Accordingly, the interlayer 7 has both electron transport and hole transport properties. That is, the interlayer 7 has bipolar properties. When the interlayer 7 has the bipolar properties as described above, holes are smoothly transferred from the red-light-emitting layer 6 to the blue-light-emitting layer 8 through the interlayer 7, and in addition, electrons can be smoothly transferred from the blue-light-emitting layer 8 to the red-light-emitting layer 6 through the interlayer 7. As a result, light emission can be performed by efficiently injecting electrons and holes into the red-light-emitting layer 6 and the blue-light-emitting layer 8, respectively.

As the electron transport material which can be used for the interlayer 7, any material may be used as long as it enables the interlayer 7 to have the functions described above, and for example, acene-based materials may be used. Since the acene-based materials have superior electron transport properties, electrons can be smoothly transferred from the blue-light-emitting layer 8 to the red-light-emitting layer 6 through the interlayer 7. In addition, since the acene-based materials have superior resistance against excitons, degradation of the interlayer 7 caused by excitons can be prevented or suppressed, and as a result, the light-emitting element 1 may have superior durability.

As the acene-based materials described above, for example, anthracene derivatives and tetracene derivatives may be mentioned. As the anthracene derivatives, for example, the anthracene derivative shown by the above chemical formula 4 may be mentioned. As the tetracene derivatives, for example, the tetracene derivative shown by the above chemical formula 5 may be mentioned.

When the interlayer 7 simultaneously includes a hole transport material and an electron transport material, although the content of the hole transport material in the interlayer 7 is not particularly limited, the content is preferably 30 to 95 percent by weight, more preferably 40 to 90 percent by weight, and even more preferably 50 to 80 percent by weight.

In addition, although the content of the acene-based material in the interlayer 7 is not particularly limited, the content is preferably 5 to 70 percent by weight, more preferably 10 to 60 percent by weight, and even more preferably 20 to 50 percent by weight.

When the content of the hole transport material in the interlayer 7 is represented by $C_H$ [percent by weight], and the content of the electron transport material is represented by $C_E$ [percent by weight], $0.5 \leq C_H/C_E \leq 20$ is preferably satisfied, and $1.0 \leq C_H/C_E \leq 10$ is more preferably satisfied. Accordingly, while the resistance of the interlayer 7 against carriers and excitons can be more reliably improved, light emissions can be performed by injecting electrons and holes into the red-light-emitting layer 6 and blue-light-emitting layer 8, respectively, and the light emission balance between the individual light-emitting layers can be further improved. In addition, even when the voltage applied to the light-emitting element 1 is changed, the light emission balance between the individual light-emitting layers is more unlikely to change.

The average thickness of the interlayer 7 is preferably 5 to 40 nm and more preferably 10 to 30 nm.

Blue-Light-Emitting Layer

The blue-light-emitting layer (second light-emitting layer) 8 includes a blue-light-emitting material (second light-emitting material) which emits a blue color (second color).

Since light having a relatively short wavelength is used as the second color, a light-emitting material having a relatively large band gap can be used. The light-emitting material having a relatively large band gap is not likely to trap holes and electrons as compared to that having a relatively small band gap. However, since the blue-light-emitting layer 8 is disposed at the position as described above, holes and electrons are sufficiently supplied to the blue-light-emitting layer 8, and hence the blue-light-emitting layer 8 can be made to sufficiently emit light. In addition, energy of excitons generated by recombination between electrons and holes in the vicinity of the interface between the interlayer 7 and the blue-light-emitting layer 8 can be efficiently used for light emission of the blue-light-emitting layer 8. Hence, the individual light-emitting layers can emit light with good balance. In addition, even if the voltage applied to the light-emitting element 1 is minute or is changed, the light emission balance between the individual light-emitting layers is not likely to change.

The blue-light-emitting material as described above is not particularly limited, and various blue fluorescent materials and various blue phosphorescent materials may be used alone or in combination of at least two thereof.

As the blue fluorescent material, any material may be used as long as it emits blue fluorescence, and for example, distyrylamine derivatives, such as distyryldiamine-based compound shown by the following chemical formula 6, fluoranthene derivatives, pyrene derivatives, perylene and perylene derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi) may be mentioned, and those materials mentioned above may be used alone or in combination of at least two thereof.

Chemical Formula 6

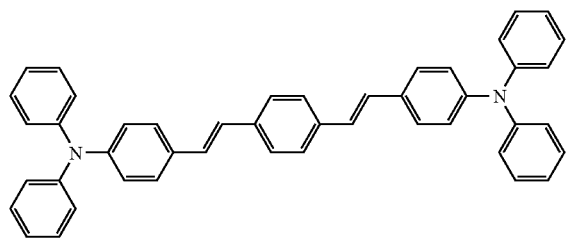

As the blue phosphorescent materials, any material may be used as long as it emits blue phosphorescence, and for example, metal complexes of iridium, ruthenium, platinum, osmium, rhenium, palladium, and the like may be mentioned. In more particular, there may be mentioned bis[4,6-difluorophenylpyridinate-N,$C^{2'}$]-picolinate-iridium, tris[2-(2,4-difluorophenyl)pyridinate-N,$C^{2'}$]iridium, bis[2-(3,5-trifluoromethyl)pyridinate-N,$C^{2'}$]-picolinate-iridium, and bis(4,6-difluorophenylpyridinate-N,$C^{2'}$)iridium(acetylacetonate)

In addition, as the constituent material for the blue-light-emitting layer 8, a host material (second host material) may be used in combination with the blue-light-emitting material described above functioning as a guest material. As the host material which can be used for the blue-light-emitting layer 8, a host material similar to the aforementioned first host material for the red-light-emitting layer 6 may be used.

When the blue-light-emitting layer 8 includes the second host material, the content (dosage) of the blue-light-emitting material in the blue-light-emitting layer 8 is preferably 0.1 to 20 percent by weight and more preferably 2 to 15 percent by weight. When the content of the blue-light-emitting material is set in the range described above, the light emission efficiency can be optimized, and while the light emission amount of the red-light-emitting layer 6 and that of the green-light-emitting layer 9 which will be described later are well balanced, the blue-light-emitting layer 8 can be made to emit light.

In addition, although the average thickness of the blue-light-emitting layer 8 is not particularly limited, the thickness is preferably 5 to 100 nm and more preferably 10 to 50 nm.

Green-Light-Emitting Layer

The green-light-emitting layer (third light-emitting layer) 9 includes a green-light-emitting material (third light-emitting material) which emits a green color (third color).

The green-light-emitting material as described above is not particularly limited, and various green fluorescent materials and various green phosphorescent materials may be used alone or in combination of at least two thereof.

As the green fluorescent materials, any material may be used as long as it emits green fluorescence, and for example, coumarin derivatives, quinacridone derivatives, such as N,N'-dimethyl quinacridone shown by the following chemical formula 7, anthracene derivatives, such as 9,10-bis[(9-ethyl-3-carbazole)-vinylenyl]-anthracene, and fluoranthene derivatives may be mentioned and may be used alone or in combination of at least two of the above materials.

Chemical Formula 7

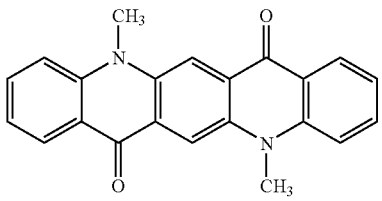

As the green phosphorescent material, any material may be used as long as it emits green phosphorescence, and for example, metal complexes of iridium, ruthenium, platinum, osmium, rhenium, palladium, and the like may be mentioned. Among those mentioned above, a metal complex is preferable in which at least one ligand thereof has a phenylpyridine skeleton, a bipyridyl skeleton, a porphyrin skeleton, or the like. In more particular, for example, there may be mentioned fac-tris(2-phenylpyridine)iridium (Ir(ppy)3), bis(2-phenylpyridinate-N,$C^{2'}$)iridium(acetylacetonate), and fac-tris[5-fluoro-2-(5-trifluoromethyl-2-pyridine)phenyl-C,N]iridium.

In addition, the green-light-emitting layer 9 may include a host material (third host material). As the third host material for the green-light-emitting layer 9, a host material similar to the aforementioned host material for the red-light-emitting layer 6 may also be used.

When the green-light-emitting layer 9 includes the third host material, the content (dosage) of the green-light-emitting material in the green-light-emitting layer 9 is preferably 0.01 to 20 percent by weight and more preferably 1 to 15 percent by weight. When the content of the green-light-emitting material is set in the range described above, the light emission efficiency can be optimized, and while the light emission amount of the red-light-emitting layer 6 and that of the blue-light-emitting layer 8 are well balanced, the green-light-emitting layer 9 can be made to emit light.

In addition, although the average thickness of the green-light-emitting layer 9 is not particularly limited, the thickness is preferably 5 to 100 nm and more preferably 10 to 50 nm.

Electron Transport Layer

The electron transport layer 10 functions to transport electrons injected from the cathode 12 to the green-light-emitting layer 9 through the electron injection layer 11.

As a constituent material (electron transport material) for the electron transport layer 10, for example, organometallic complexes, such as tris(8-quinolinolato)aluminum ($Alq_3$) shown by the following chemical formula 8, including 8-quinolinol or a derivative thereof as a ligand, oxadiazole derivatives, perylene derivatives, pyridine derivatives, pyrimidine derivatives, quinoxaline derivatives, diphenylquinone derivatives, nitro-substituted fluorene derivatives may be mentioned and may be used alone or in combination of at least two thereof.

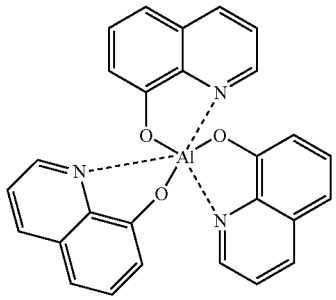

Chemical Formula 8

Although the average thickness of the electron transport layer 10 is not particularly limited, the thickness is preferably 1 to 100 nm and more preferably 5 to 50 nm.

Electron Injection Layer

The electron injection layer 11 functions to improve the electron injection efficiency from the cathode 12.

In this embodiment, the electron adjust layer 41 which will be described later is extended so as to overlap the light-emitting layers in a thickness direction of the electron adjust layer 41, and this overlapped portion forms the electron injection layer 11. In other words, a part of the electron adjust layer 41 also functions as the electron injection layer 11. Accordingly, since the electron adjust layer 41 and the electron injection layer 11 can be collectively and simultaneously formed, the light-emitting device 101 can be efficiently manufactured.

As a constituent material (electron injection material) for the electron injection layer 11, for example, various inorganic insulating materials and various inorganic semiconductor materials may be mentioned.

As the inorganic insulating materials mentioned above, for example, alkali metal chalcogenides (oxides, sulfides, selenides, and tellurides), alkaline earth metal chalcogenides, alkali metal halides, and alkaline earth metal halides may be mentioned and may be used alone or in combinations of at least two thereof. By using at least one of these materials as a primary material of the electron injection layer, the electron injection properties can be further improved. In particular, since alkali metal compounds (such as alkali metal chalcogenides and alkali metal halides) have a very small work function, when the electron injection layer 11 is formed using at least one of the compounds described above, the light-emitting element 1 can achieve high luminance.

As the alkali metal chalcogenides, for example, $Li_2O$, LiO, $Na_2S$, $Na_2Se$, and NaO may be mentioned.

As the alkaline earth metal chalcogenides, for example, CaO, BaO, SrO, BeO, BaS, MgO, and CaSe may be mentioned.

As the alkali metal halides, for example, CsF, LiF, NaF, KF, LiCl, KCl, and NaCl may be mentioned.

As the alkali earth metal halides, for example, $CaF_2$, $BaF_2$, $SrF_2$, $MgF_2$ and $BeF_2$ may be mentioned.

In addition, as the inorganic semiconductor materials, for example, oxides, nitrides, and oxynitrides, each of which contains at least one element selected from the group consisting of Li, Na, Ba, Ca, Sr, Yb, Al, Ga, In, Cd, Mg, Si, Ta, Sb, and Zn, may be mentioned and may be used alone or in combination at least two of the above compounds.

In particular, in this embodiment, since being formed by extending the electron adjust layer 41, the electron injection layer 11 is formed of the same material as that for the electron adjust layer 41. Accordingly, even when a part of the electron adjust layer 41 is not also used as the electron injection layer 11, the electron injection layer 11 and the electron adjust layer 41 can be easily formed at the same time.

Although the average thickness of the electron injection layer 11 is not particularly limited, the thickness is preferably 0.2 to 10 nm and more preferably 0.5 to 5 nm.

Power Source

The power source 25 applies the drive voltage between the anode 3 and the cathode 12 through the anode terminal 43 and the cathode terminal 40, respectively. The power source 25 supplies electricity of the drive voltage necessary for light emission.

Anode Terminal

The anode terminal 43 is connected to the power source 25 and supplies holes supplied from the power source 25 to the anode 3 through the drive transistor (switching element) 24.

As a constituent material for the anode terminal 43, for example, Li, Mg, Ca, Sr, La, Ce, Er, Eu, Sc, Y, Yb, Ag, Cu, Al, Cs, Rb or an alloy containing at least one of the above elements may be mentioned and may be used alone or in combination of at least two thereof (for example, a laminate including a plurality of layers).

Cathode Terminal

The cathode terminal 40 is provided on the substrate at a position apart from the light-emitting element 1 so as to be in contact with the electron adjust layer 41 and is electrically connected to the power source 25. The cathode terminal 40 supplies electrons supplied from the power source 25 to the cathode 12.

As a constituent material for the cathode terminal 40, for example, Li, Mg, Ca, Sr, La, Ce, Er, Eu, Sc, Y, Yb, Ag, Cu, Al, Cs, Rb or an alloy containing at least one of the above elements may be mentioned and may be used alone or in combination of at least two thereof (for example, a laminate including a plurality of layers).

Switching Element

In addition, the control of the drive voltage applied to the light-emitting element 1 is performed by the switching element 24. The switching element 24 is a drive transistor provided between the anode 3 and the power source 25 and connects therebetween by its operation. In addition, when the operation of the switching element 24 is released, the connection between the anode 3 and the power source 25 is released. That is, the switching element 24 controls the intensity of the drive voltage applied between the anode 3 and the cathode 12.

Electron Adjust Layer

In addition, between the cathode terminal 40 and the cathode 12, the electron adjust layer 41 which includes a material having insulating properties is provided in contact with the cathode terminal 40 and the cathode 12. In addition, the cathode 12 and the cathode terminal 40 are connected to each other with the electron adjust layer 41 interposed therebetween. The electron adjust layer 41 described above functions to adjust the amount of electrons supplied from the cathode terminal 40 to the cathode 12.

The above point is the feature of the invention.

That is, when the operation of the switching element 24 is released, it is configured that, in principle, the voltage is not applied between the anode 3 and the cathode terminal 40. However, in practice, a very minute voltage is applied between the anode 3 and the cathode terminal 40. Under the conditions as described above, in a related light-emitting device, a minute voltage is applied between a cathode and an anode, and a light-emitting element is liable to emit light. Accordingly, in the related light-emitting device, the black floating phenomenon is disadvantageously liable to occur.

On the other hand, in the light-emitting device 101, since the electron adjust layer 41 includes a material having insulating properties, electrical resistance is provided between the cathode terminal 40 and the cathode 12, and as a result, when a minute voltage is applied between the anode 3 and the cathode terminal 40, the electron adjust layer 41 can prevent movement of electrons from the cathode terminal 40 to the cathode 12. As a result, under the conditions described above, a minute voltage is prevented from being applied between the anode 3 and the cathode 12, so that slight light emission of the light-emitting element 1 can be prevented. That is, the generation of an unfavorable black floating phenomenon can be prevented.

In addition, the electron adjust layer 41 is provided so that a part thereof is overlapped with the cathode terminal 40 in the thickness direction of the electron adjust layer 41. Accordingly, the electron adjust layer 41 can reliably receive electrons from the cathode terminal 40 and also can adjust the amount of electrons supplied to the cathode 12, so that the black floating phenomenon can be prevented. In addition, when light is emitted, the electron adjust layer 41 can preferably supply electrons to the cathode 12.

Furthermore, when the switching element 24 is driven, and the drive voltage is applied between the anode 3 and the cathode 12, the electron adjust layer 41 has insulating properties so as not disturb the movement of electrons from the cathode terminal 40 to the cathode 12. Accordingly, the black floating phenomenon can be preferably prevented.

Furthermore, when the switching element 24 stops the application of voltage between the anode 3 and the cathode 12, the electron adjust layer 41 has insulating properties so as to prevent the movement of electrons from the cathode terminal 40 to the cathode 12. Accordingly, when the light-emitting element 1 is made to emit light while the black floating phenomenon is prevented, electrons are efficiently supplied from the cathode terminal 40 to the cathode 12, and hence the light-emitting element 1 preferably emits light.

In particular, the electron adjust layer 41 has an average thickness so as to enable electrons to pass therethrough from the cathode terminal 40 to the cathode 12 by the Hall effect.

In more particular, the average thickness of the electron adjust layer 41 is preferably 0.2 to 10 nm and more preferably 0.5 to 5 nm. Accordingly, when the drive voltage is applied between the anode 3 and the cathode 12, electrons can be efficiently moved from the cathode terminal 40 to the cathode 12 through the electron adjust layer 41 by the Hall effect, and when the application of voltage between the anode 3 and the cathode 12 is stopped by the switching element 24, and when a minute voltage is applied between the anode 3 and the cathode terminal 40, electrons are prevented from passing through the electron adjust layer 41.

For the electron adjust layer 41, any material may be used as long as it has insulating properties, and for example, ferroelectric materials, such as lead titanate zirconate and barium titanate, alkaline metal oxides, such as $Li_2O$, LiO, and NaO, alkali metal halides, such as CsF, LiF, NaF, KF, LiCl, KCl, and NaCl, alkaline earth metal oxides, such as CaO, BaO, SrO, BeO, and MgO, and alkaline earth metal halides, such as $CaF_2$, $BaF_2$, $SrF_2$, $MgF_2$, and $BeF_2$, may be mentioned and may be used alone or in combination of at least two thereof. The materials mentioned above each have sufficiently high insulating properties, and when being formed into a thin film, the above materials each enable electrons to pass therethrough by the Hall effect when the drive voltage is applied. That is, the generation of the black floating phenomenon is preferably suppressed, and in addition, by the application of drive voltage, the light-emitting element 1 preferably emits light.

Among the materials mentioned above, the material having insulating properties preferably includes a lithium compound, such as $Li_2O$, LiO, or LiF and more preferably includes LiF. Accordingly, the effect described above can be made more significant.

Auxiliary Cathode

The auxiliary cathode 42 is provided on the surface of the cathode 12 opposite to the electron adjust layer 41 at a position which is overlapped with the cathode terminal 40 in a thickness direction of the cathode 12 and which is not overlapped with the light-emitting element 1. This auxiliary cathode 42 has a high electrical conductivity as compared to that of the cathode 12 and functions to assist the transportation of electrons of the cathode 12. That is, since the cathode 12 is required to have electron injection properties into the laminate 15 of the light-emitting element 1, depending on the structure of the laminate 15, a material having a sufficiently high electrical conductivity may not be used, and as a result, the drive voltage of the entire light-emitting device 101 is inevitably increased to a relatively high value in some cases; however, when the auxiliary cathode 42 assists the transportation of electrons of the cathode 12, the drive voltage of the entire light-emitting device 101 can be decreased to a relatively small value. As a result, when the application of voltage between the cathode 12 and the anode 3 is stopped, the voltage applied between the cathode terminal 40 and the anode 3 is further decreased, and hence the black floating phenomenon can be preferably prevented.

In addition, although being not overlapped with the light-emitting element 1 in a thickness direction thereof, the auxiliary cathode 42 is disposed to extend to the vicinity of the light-emitting element 1. Hence, the auxiliary cathode 42 can efficiently assist the transportation of electrons of the cathode 12, and hence the drive voltage of the light-emitting device 101 can be further decreased.

As described above, the auxiliary cathode 42 is disposed in contact with the cathode 12. Accordingly, the auxiliary cathode 42 can efficiently assist the transportation of electrons of the cathode 12, and the drive voltage of the light-emitting device 101 can be further decreased.

As a constituent material for the auxiliary cathode 42, any material may be used as long as it has a high electrical conductivity as compared to that of the material forming the cathode 12, and for example, Ag, Cu, Al, or an alloy thereof may be mentioned and may be used alone or in combination of at least two thereof (for example, a laminate including a plurality of layers).

In addition, although the average thickness of the auxiliary cathode 42 is not particularly limited, the thickness is preferably 10 to 500 nm and more preferably 100 to 300 nm. Accordingly, the auxiliary cathode 42 can efficiently assist the transportation of electrons of the cathode 12, and in addition, since the thickness of the auxiliary cathode 42 is not excessively large, the thickness of the light-emitting device 101 can be prevented from being excessively increased.

Sealing Member

The sealing member is provided so as to cover the individual members of the light-emitting device 101 except for the power source 25 and has a function of air-tightly sealing the above members to block oxygen and moisture (not shown). When the sealing member is provided, effects of improvement in reliability of the light-emitting device 101, prevention of change in quality and degradation thereof (improvement in durability), and the like can be obtained.

As a constituent material for the sealing member, for example, Al, Au, Cr, Nb, Ta, Ti, and an alloy containing at least one of the above elements, a silicon oxide, and various resin materials may be mentioned. In addition, when a material having electrical conductivity is used as the constituent material for the sealing member, in order to prevent short-circuit, whenever necessary, an insulating film is preferably provided between the sealing member and the anode 3, the laminate 15, the cathode 12, the cathode terminal 40, the anode terminal 43, and the auxiliary cathode 42.

In addition, a sealing member having a plate shape is disposed to face the substrate, and for example, a sealing material of a thermosetting resin or the like may be used for sealing between the sealing member and the substrate.

According to the light-emitting device 101 having the structure described above, since the cathode terminal 40 and the cathode 12 are connected with the electron adjust layer 41 interposed therebetween, when the switching element 24 is set to stop the application of drive voltage to the light-emitting element 1, even if a minute voltage is applied between the cathode terminal 40 and the anode 3, the electron adjust layer 41 can prevent the transportation of electrons from the cathode terminal 40 to the cathode 12. As a result, when the switching element 24 is set so stop the application of voltage to the light-emitting element 1, the light-emitting element 1 is prevented from emitting light, and hence the black floating phenomenon can be prevented. Accordingly, the light-emitting device 101 can be preferably used for image display.

In particular, since the average thickness of the electron adjust layer 41 of the light-emitting device 101 is set in the range described above, the black floating phenomenon can be preferably prevented, and in addition, when the switching element 24 is driven to apply the drive voltage to the cathode 12 and the anode 3, the electron adjust layer 41 can preferably move electrons from the cathode terminal 40 to the cathode 12, so that the light-emitting element 1 can preferably emit light.

In addition, particularly in this embodiment, the light-emitting element 1 has a plurality of light-emitting layers. In general, in a light-emitting element having a plurality of light-emitting layers, since the drive voltage tends to increase, the voltage output from a power source tends to become high, and as a result, the black floating phenomenon is liable to occur. However, according to the invention, since the electron adjust layer 41 is provided, although the light-emitting element 1 has a plurality of light-emitting layers, the black floating phenomenon can be preferably prevented.

In addition, particularly in this embodiment, the light-emitting layers emit different colors from each other. Heretofore, when the black floating phenomenon is generated, among the light-emitting layers, a light-emitting layer which emits light having a longer wavelength is liable to emit light, and when the black floating phenomenon occurs, a color different from a desired color may be emitted from the light-emitting element in some cases. In particular, as the entire light-emitting element, when white light is emitted as a whole from the light-emitting layers, the problem as described above becomes serious. However, according to the invention, since the black floating phenomenon itself is prevented, the problem as described above can be prevented.

Next, a method for manufacturing a light-emitting device of the invention will be described.

The method for manufacturing a light-emitting device of the invention includes a step of forming the anode 3 and the cathode terminal 40 on the substrate, a step of forming a light-emitting layer on the anode 3 which emits light when a voltage is applied, a step of forming the electron adjust layer 41 which includes a material having insulating properties and which overlaps the light-emitting layer and the cathode terminal 40 in plan view, and a step of forming the cathode 12 on the electron adjust layer 41. In addition, as described above, the electron adjust layer 41 functions to adjust the amount of electrons supplied from the cathode terminal 40 to the cathode 12 and is also configured to function as the electron injection layer 11 which promotes injection of electrons from the cathode 12 into the light-emitting layer.

Accordingly, the light-emitting device 101 as described above can be efficiently manufactured. In particular, since the electron adjust layer 41 is formed to partially function as the electron injection layer 11, the electron injection layer 11 and the electron adjust layer 41 can be collectively formed, and thereby superior productivity can be obtained.

Hereinafter, the manufacturing method will be described in detail.

1. First, the substrate is prepared, and the anode 3 is formed. In addition, whenever necessary, on this substrate and under the anode 3, a predetermined drive transistor circuit may be formed in each pixel.

The anode 3 can be formed, for example, by a chemical vapor deposition (CVD) method, such as plasma CVD or thermal CVD, a dry plating method, such as vacuum evaporation or sputtering, a wet plating method such as electrolytic plating, a flame spray method, a sol-gel method, a metal organic decomposition (MOD) method, or bonding of a metal foil.

2. Next, at a portion on the substrate apart from the anode 3, the cathode terminal 40 is formed.

The cathode terminal 40 can be formed, for example, by a chemical vapor deposition (CVD) method, such as plasma CVD or thermal CVD, a dry plating method, such as vacuum evaporation or sputtering, a wet plating method such as electrolytic plating, a flame spray method, a sol-gel method, an MOD method, or bonding of a metal foil.

3. Next, the hole injection layer 4 is formed on the anode 3.

The hole injection layer 4 can be formed, for example, by a vapor phase process using a dry plating method, such as vacuum evaporation method, or the like.

In addition, the hole injection layer 4 may also be formed in such a way that after a material for forming a hole injection layer in which a hole injection material is dissolved in a solvent or is dispersed in a medium is supplied on the anode 3, drying (removal of the solvent or the medium) is performed.

As a method for supplying the material for forming a hole injection layer, for example, various coating methods, such as a spin coating method, a roll coating method, and an ink jet printing method, may be used. By using the coating methods mentioned above, the hole injection layer 4 can be relatively easily formed.

As the solvent and the medium for preparing the material for forming a hole injection layer, for example, various inorganic solvent, various organic solvents, or mixed solvents thereof may be mentioned.

In addition, for the drying, for example, the substrate thus processed is held in the air or a reduced-pressure environment, is processed by a heating treatment, or is blown by an inert gas.

In addition, prior to this step, an oxygen plasma treatment may be performed on the upper surface of the anode 3. Accordingly, for example, lyophilic properties can be imparted to the upper surface of the anode 3, organic materials adhered on the upper surface of the anode 3 can be removed (cleaned), and/or the work function in the vicinity of the upper surface of the anode 3 can be adjusted.

In addition, as the conditions of the oxygen plasma treatment, for example, a plasma power of approximately 100 to 800 W, an oxygen gas flow rate of approximately 50 to 100 ml/min, a transportation speed of the workpiece (anode 3) of approximately 0.5 to 10 mm/sec, and a substrate temperature of approximately 70 to 90° are preferably selected.

4. Next, the hole transport layer 5 is formed on the hole injection layer 4.

The hole transport layer 5 can be formed, for example, by a vapor phase process using a dry plating method, such as vacuum evaporation, or the like.

In addition, the hole transport layer 5 may also be formed by supplying a material for forming a hole transport layer in which a hole transport material is dissolved in a solvent or dispersed in a medium and then drying (removal of the solvent or the medium).

5. Next, the red-light-emitting layer 6 is formed on the hole transport layer 5.

The red-light-emitting layer 6 can be formed, for example, by a vapor phase process using a dry plating method, such as vacuum evaporation, or the like.

6. Next, the interlayer 7 is formed on the red-light-emitting layer 6.

The interlayer 7 can be formed, for example, by a vapor phase process using a dry plating method, such as vacuum evaporation, or the like.

7. Next, the blue-light-emitting layer 8 is formed on the interlayer 7.

The blue-light-emitting layer 8 can be formed, for example, by a vapor phase process using a dry plating method, such as vacuum evaporation, or the like.

8. Next, the green-light-emitting layer 9 is formed on the blue-light-emitting layer 8.

The green-light-emitting layer 9 can be formed, for example, by a vapor phase process using a dry plating method, such as vacuum evaporation, or the like.

9. Next, the electron transport layer 10 is formed on the green-light-emitting layer 9.

The electron transport layer 10 can be formed, for example, by a vapor phase process using a dry plating method, such as vacuum evaporation, or the like.

In addition, the electron transport layer 10 may also be formed by supplying a material for forming an electron transport layer in which an electron transport material is dissolved in a solvent or dispersed in a medium and then drying (removal of the solvent or the medium).

10. Next, the electron adjust layer 41 is continuously formed on the electron transport layer 10 and the cathode terminal 40.

In this embodiment, the electron adjust layer 41 partially functions as the electron injection layer 11, and when the electron adjust layer 41 is formed, the electron injection layer 11 is simultaneously formed on the electron transport layer 10.

The electron adjust layer 41 can be formed, for example, by a vapor phase process using a dry plating method, such as vacuum evaporation or sputtering, or the like or by application and firing of an inorganic fine particle ink.

11. Next, the cathode 12 is formed on the electron adjust layer 41.

The cathode 12 can be formed, for example, by a vacuum evaporation method, a sputtering method, bonding of a metal foil, or application and firing of a metal fine particle ink.

12. Next, the auxiliary cathode 42 is formed on the cathode 12 in plan view from a position overlapped with the cathode terminal 40 to a position in the vicinity of the anode 3 so as not to be overlapped therewith.

The auxiliary cathode 42 can be formed, for example, by a vacuum evaporation method, a sputtering method, bonding of a metal foil, or a coating method of a metal fine particle ink.

13. Next, the anode terminal 43 and the cathode terminal 40 are connected to the power source 25.

14. Finally, the light-emitting element 1, the cathode terminal 40, the electron adjust layer 41, and the auxiliary cathode 42 which are thus obtained are covered with a sealing member 34 and are bonded to the substrate.

By the steps described above, the light-emitting device 101 including the light-emitting element 1 can be obtained.

In addition, the switching element 24, the anode terminal 43, and other necessary wires and the like may be formed in advance as parts of the substrate.

The light-emitting device 101 as described above may be used, for example, as a light source. In addition, when a plurality of the light-emitting elements 1 is disposed in matrix, a display device (display device of the invention) can be formed.

Incidentally, a driving method of the display device is not particularly limited, and either an active matrix method or a passive matrix method may be used.

Next, one example of a display device using the light-emitting device of the invention will be described.

Display Device

A display device 100 shown in FIG. 2 includes a light-emitting device 101A which has a plurality of light-emitting elements $1_R$, $1_G$, and $1_B$ and a color filter 102 which has filter portions $19_R$, $19_G$, and $19_B$ provided in association with the light-emitting elements $1_R$, $1_G$, and $1_B$, respectively.

In the display device 100 described above, the light-emitting elements $1_R$, $1_G$, and $1_B$ and the filter portions $19_R$, $19_G$, and $19_B$ are provided in association with sub-pixels $100_R$, $100_G$, and $100_B$, respectively, to form a display panel having a top emission structure.

In addition, in this embodiment, although an active matrix method will be described by way of example as a driving method of the display device, a display device using a passive matrix method may also be used.

As shown in FIGS. 2 and 3, the light-emitting device 101A includes a substrate 21, a plurality of the anodes 3, the cathode 12, the laminate 15, a plurality of the switching elements 24, the two cathode terminals 40, and a plurality of the anode terminals 43. In addition, when the substrate 21 is viewed in plan, regions which include the cathode 12 and the anodes 3 and which are sandwiched therebetween form the light-emitting elements $1_R$, $1_G$, and $1_B$. In addition, as shown in FIG. 3, at the vicinity of the center of the substrate 21, a light-emitting region 50 having an approximately rectangular shape surrounded by points A, B, C, and D is provided, and the individual light-emitting elements $1_R$, $1_G$, and $1_B$ are disposed in a matrix in the light-emitting region 50 on the substrate 21.

The substrate 21 functions to support the light-emitting elements $1_R$, $1_G$, and $1_B$ and the switching elements 24.

The switching elements 24 are provided for the respective light-emitting elements $1_R$, $1_G$, and $1_B$ and function as drive transistors to drive the respective light-emitting elements $1_R$, $1_G$, and $1_B$.

The switching elements 24 each include a semiconductor layer 241 made of silicon, a gate insulating layer 242 formed on the semiconductor layer 241, a gate electrode 243 formed on the gate insulating layer 242, a source electrode 244, and a drain electrode 245.

When a voltage is applied to the gate electrode 243, the switching element 24 is operated to electrically connect between the source electrode 244 and the drain electrode 245. In addition, when the voltage applied to the gate electrode 243 is adjusted, a current flowing between the source electrode 244 and the drain electrode 245 can be adjusted, and as a result, voltages applied to the respective light-emitting elements $1_R$, $1_G$, and $1_B$ can be adjusted.

A planarizing layer 22 made of an insulating material is formed to cover the switching elements 24 described above.

In each sub-pixel in the light-emitting region 50, a reflection film 32, a corrosion prevention film 33, the anode 3, the laminate 15, the cathode 12, and the sealing member 34 are laminated on the planarizing layer 22 in this order.

The anodes 3 are disposed in a matrix in plan view to form pixel electrodes and are each electrically connected to the drain electrode 245 of the switching element 24 through a conduction portion (wire) 27.

In addition, the cathode 12 is used as a common electrode for the light-emitting elements $1_R$, $1_G$, and $1_B$, and the long side of the cathode 12 is extended from the light-emitting region 50 to intersect the cathode terminals 40 in plan view. In other words, the cathode 12 has a rectangular shape surrounded by points E, F, G, and H in which the long side is larger than that of the light-emitting region 50. In addition, the cathode 12 is electrically connected to the cathode terminals 40 with the electron adjust layer 41 interposed therebetween.

In addition, the laminate 15 except for the electron adjust layer 41 is provided in the light-emitting region 50 in plan view. In addition, in plan view, the electron adjust layer 41 is extended in a long side direction thereof from the light-emitting region 50 to intersect the cathode terminals 40 which will be described later and to come into contact therewith and has the same shape as that of the cathode 12 in this embodiment.

In addition, in plan view, at the position at which the anode 3 is disposed, the reflection film 32, the corrosion prevention film 33, the anode 3, the laminate 15, and the cathode 12 form each of the light-emitting elements $1_R$, $1_G$, and $1_R$.

In addition, the structure of each of the light-emitting elements $1_G$ and $1_B$ is the same as that of the light-emitting element $1_R$. In FIG. 2, elements similar to those of FIG. 1 are designated by the same reference numerals. In addition, the structure (properties) of the reflection film 32 may be different between the light-emitting elements $1_R$, $1_G$, and $1_B$ in accordance with the wavelength of light.

In addition, between adjacent light-emitting elements $1_R$, $1_G$, and $1_B$, partitions 31 are provided.

Furthermore, as shown in FIG. 3, at two sides of the light-emitting region 50 in the longitudinal direction in plan view, the cathode terminals 40 each having an approximately rectangular shape are provided perpendicular to the light-emitting region 50. The cathode terminals 40 are connected to the electron adjust layer 41 and are connected to the cathode 12 therethrough.

In addition, as shown in plan view, a plurality of auxiliary cathodes 42 is provided on the cathode 12 so as to overlap the two cathode terminals 40 across the light-emitting region 50 and so as not to overlap the light-emitting elements $1_R$, $1_G$, and $1_B$ therein.

The color filter 102 is bonded to the light-emitting device 101A formed as described above with a resin layer 35 made of a thermosetting resin, such as an epoxy resin, interposed therebetween.

The color filter 102 includes a substrate 20, a plurality of the filter portions $19_R$, $19_G$, and $19_B$, and a light shielding layer 36.

The substrate (sealing substrate) 20 functions to support the filter portions $19_R$, $19_G$, and $19_B$ and the light shielding layer 36. For the substrate 20, a transparent substrate is used.

As a constituent material for the substrate 20 as described above, any material may be used as long as it has optical transparency, and a material similar to the constituent material for the substrate 21 described above may be used.

The filter portions $19_R$, $19_G$, and $19_B$ are provided in association with the light-emitting elements $1_R$, $1_G$, and $1_B$.

The filter portion $19_R$ functions to convert white light $W_R$ from the light-emitting element $1_R$ to a red color. In addition, the filter portion $19_G$ functions to convert white light $W_G$ from the light-emitting element $1_G$ to a green color. Furthermore, the filter portion $19_B$ functions to convert white light $W_B$ from the light-emitting element $1_B$ to a blue color. Since the filter portions $19_R$, $19_G$, and $19_B$ are used in combination with the light-emitting elements $1_R$, $1_G$, and $1_B$, a full-color image can be displayed.

Between adjacent filter portions $19_R$, $19_G$, and $19_B$, the light shielding layer 36 is formed. This light shielding layer 36 functions to prevent light emission from unintended sub-pixels $100_R$, $100_G$, and $100_B$.

Since including the light-emitting device as described above, the display device 100 (display device of the invention) can prevent the black floating phenomenon and can reliably display a high-quality image.

In addition, the display device 100 described above may perform monochromatic display.

Furthermore, the display device 100 (display device of the invention) as described above may be installed in various types of electronic apparatuses.

Figure 4:
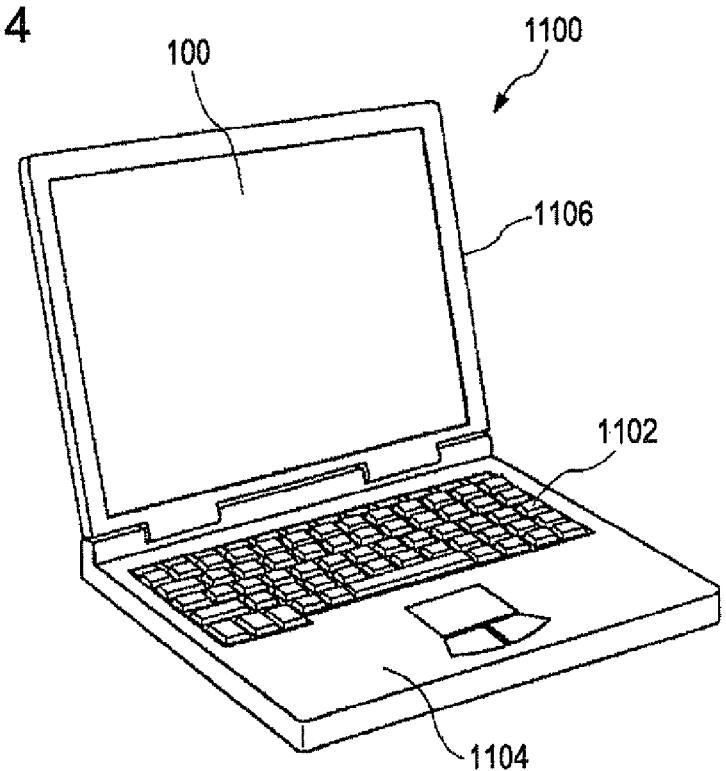
FIG. 4 is a perspective view showing the structure of a mobile (or a notebook) personal computer which uses an electronic apparatus of the invention.

FIG. 4 is a perspective view showing the structure of a mobile (or a notebook) personal computer using an electronic apparatus of the invention.

In this figure, a personal computer 1100 includes a main body 1104 having a keyboard 1102 and a display unit 1106 having a display portion, and the display unit 1106 is rotatably fixed to the main body 1104 with a hinge structure provided therebetween.

In this personal computer 1100, the display portion of the display unit 1106 is formed of the above-described display device 100.

Figure 5:
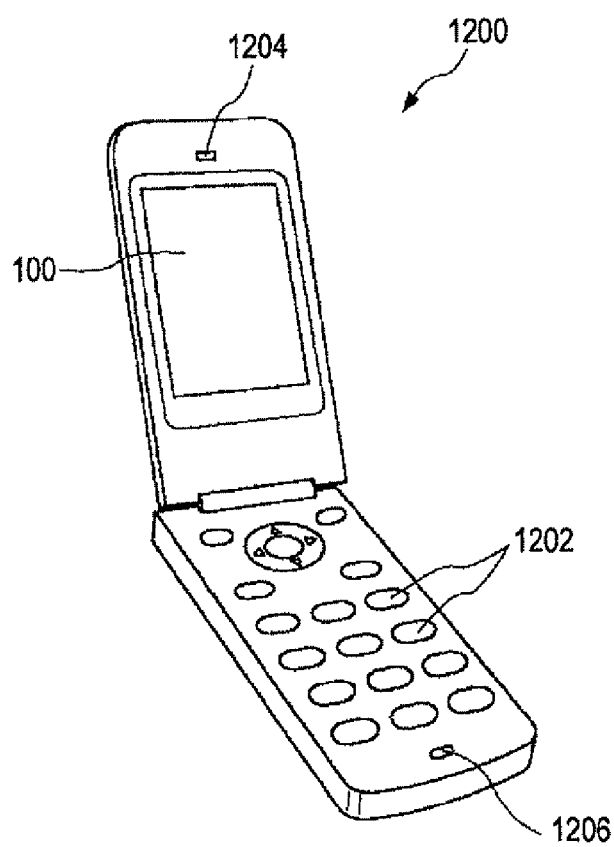
FIG. 5 is a perspective view showing the structure of a mobile phone (including a PHS) which uses an electronic apparatus of the invention.

FIG. 5 is a perspective view showing the structure of a mobile phone (including a PHS) using an electronic apparatus of the invention.

In this figure, a mobile phone 1200 includes a display portion as well as a plurality of operation buttons 1202, an earpiece 1204, and a mouthpiece 1206.

In the mobile phone 1200, this display portion is formed of the above-described display device 100.

Figure 6:
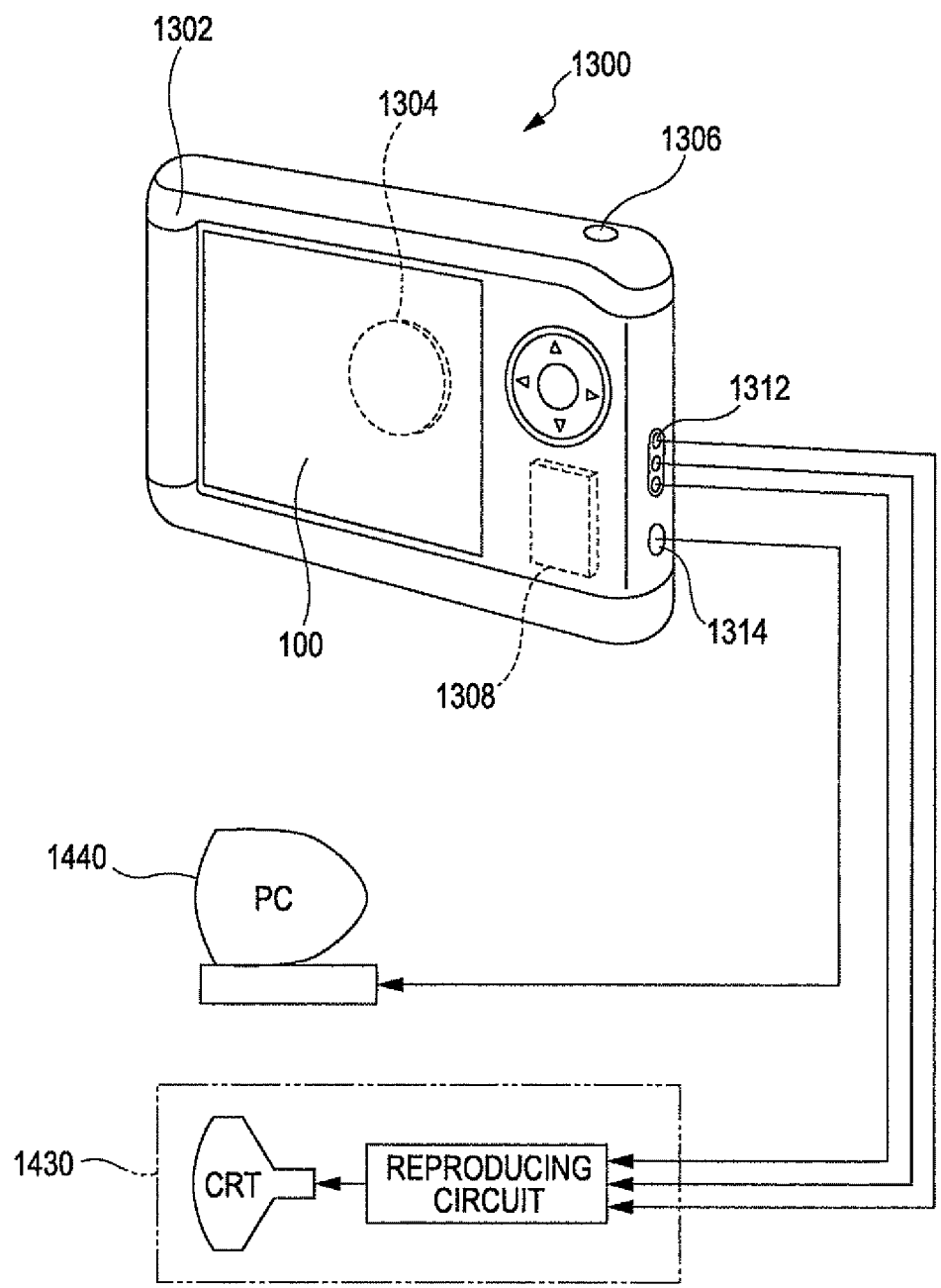
FIG. 6 is a perspective view showing the structure of a digital still camera which uses an electronic apparatus of the invention.

FIG. 6 is a perspective view showing the structure of a digital still camera using an electronic apparatus of the invention. In this figure, connection with external apparatuses is also schematically shown.

In a common camera, a silver halide photographic film is exposed to an optical image of an object; however, in a digital still camera 1300, an optical image of an object is photoelectric-converted by an image-pickup device, such as a CCD (charged coupled device) to generate image-pickup signals (image signals).

A display portion is provided on the rear surface of a case (body) 1302 of the digital still camera 1300 so as to perform display based on image-pickup signals obtained by the CCD and functions as a finder to display an object as an electronic image.

In the digital still camera 1300, this display portion is formed of the above-described display device 100.

A circuit board 1308 is provided inside the case. This circuit board 1308 includes a memory that can store (memorize) image-pickup signals.

Furthermore, a light-receiving unit 1304 including an optical lens (image-pickup optical system), the CCD, and the like is provided on the front side (on the back side of the structure shown in the figure) of the case 1302.

When a user confirms an image of an object displayed on the display portion and pushes a shutter button 1306, image-pickup signals of the CCD at that moment are transferred and stored in the memory of the circuit board 1308.

Furthermore, in the digital still camera 1300, video signal output terminals 1312 and a data-communication input/output terminal 1314 are provided on a side surface of the case 1302. In addition, as shown in the figure, whenever necessary, a television monitor 1430 is connected to the video signal output terminals 1312, and a personal computer 1440 is connected to the data-communication input/output terminal 1314. Furthermore, the image-pickup signals stored in the memory of the circuit board 1308 are output to the television monitor 1430 or the personal computer 1440 by a predetermined operation.

In addition to the personal computer (mobile personal computer) shown in FIG. 4, the mobile phone shown in FIG. 5, and the digital still camera shown in FIG. 6, for example, the electronic apparatus of the invention may be applied to a television, a video camera, viewfinder-type and direct-monitoring-type video tape recorders, a laptop personal computer, a car navigation system, a pager, an electronic notebook (including an electronic notebook having a communication function), an electronic dictionary, an electronic calculator, an electronic game device, a word processor, a workstation, a video telephone, a security television monitor, electronic binoculars, a POS terminal, devices with a touch panel (such as a cash dispenser in a financial institution and an automatic ticket vending machine), medical instruments (such as an electronic thermometer, a blood pressure gauge, a blood sugar meter, an electrocardiogram display device, an ultrasonic diagnostic device, and a display device for an endoscope), a fish detector, various types of measuring apparatuses, measuring gauges (such as measuring gauges of vehicles, aircraft, and vessels), a flight simulator, various types of monitors, and a projection display device such as a projector.

Heretofore, the light-emitting device, the manufacturing method thereof, the display device, and the electronic apparatus of the invention have been described with reference to the embodiments shown in the figures; however, the invention is not limited thereto.

For example, in the embodiments described above, although the light-emitting device has the structure in which the cathode terminal, the electron adjust layer, the cathode, and the auxiliary cathode are laminated in this order, the structure is not limited thereto.

For example, the light-emitting device may have one of the following structures shown in FIGS. 7 to 11.

Figure 7:
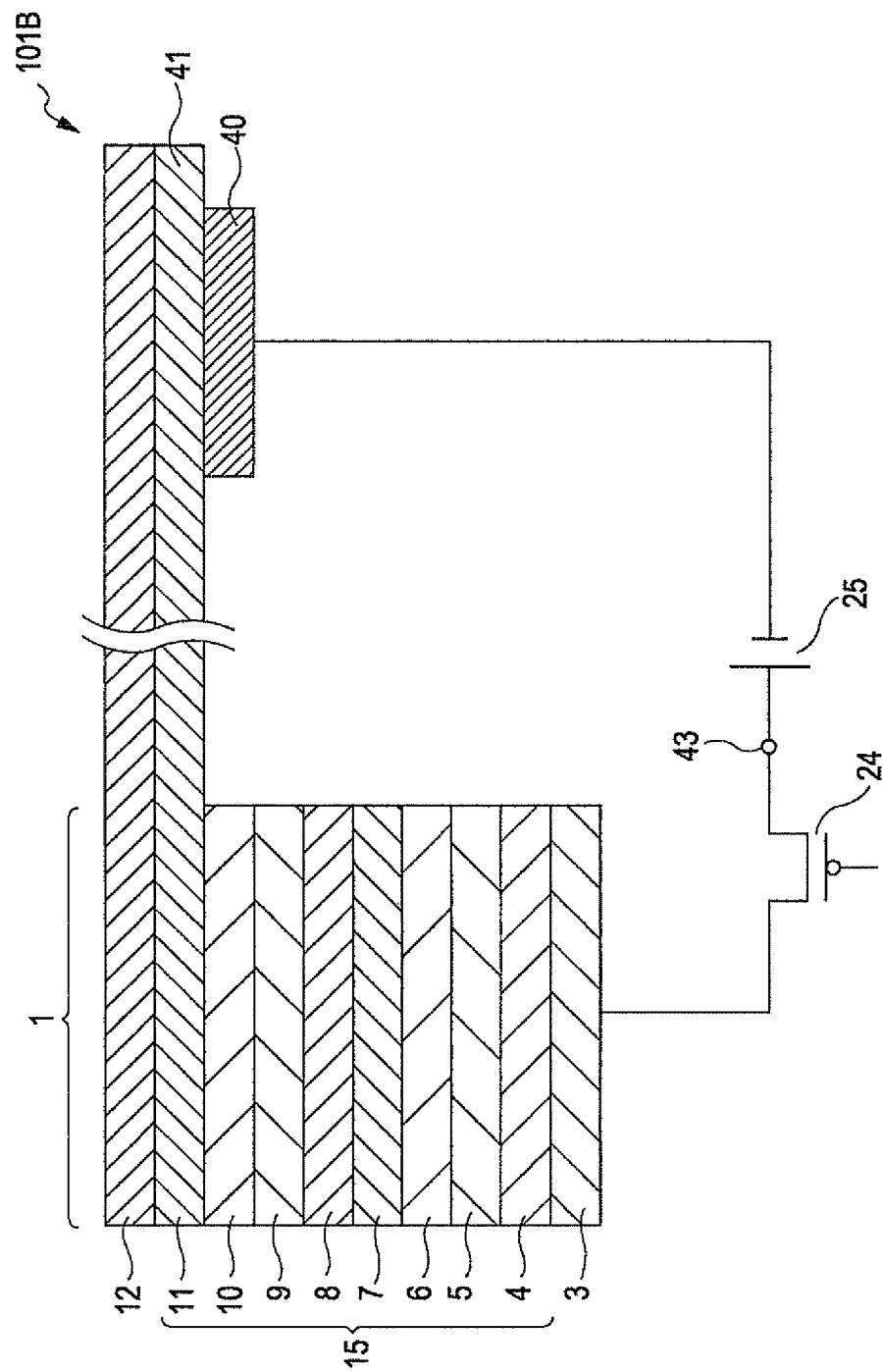
FIG. 7 is a vertical cross-sectional view schematically showing one example of another preferable embodiment of the light-emitting device of the invention.

In FIG. 7, in a light-emitting device 101B, the auxiliary cathode is omitted as compared to the light-emitting device 101 shown in FIG. 1.

Figure 8:
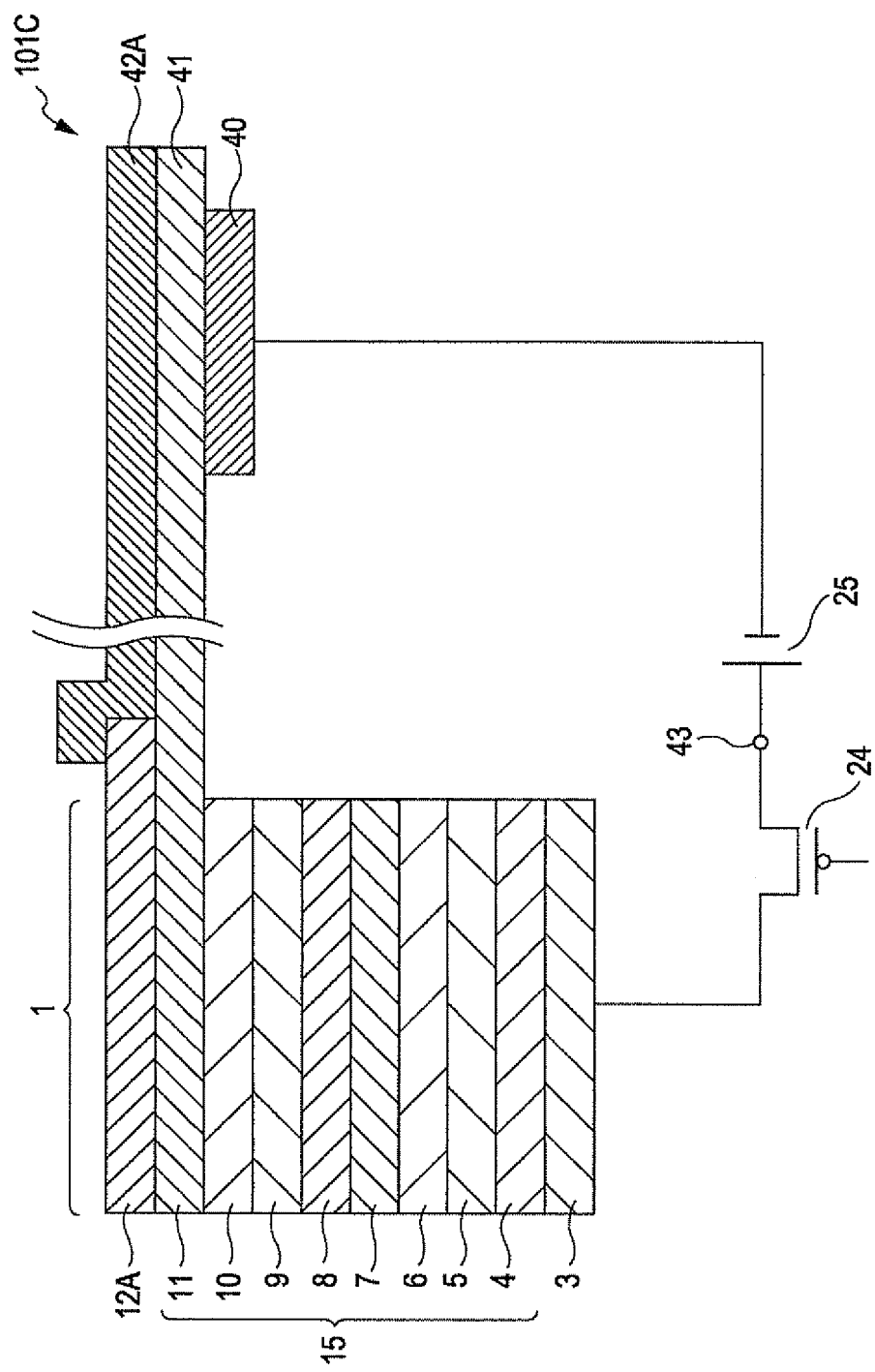
FIG. 8 is a vertical cross-sectional view schematically showing one example of another preferable embodiment of the light-emitting device of the invention.

In FIG. 8, in a light-emitting device 101C, a cathode 12A is not overlapped in a thickness direction thereof with the cathode terminal 40, and a portion extending from the light-emitting element 1 is small as compared to that of the electron adjust layer 41. In addition, an auxiliary cathode 42A is provided directly on the electron adjust layer 41 at a side opposite to the cathode terminal 40, and one end of the auxiliary cathode 42A is overlapped in a thickness direction thereof with the cathode 12A and is also in contact therewith.

Figure 9:
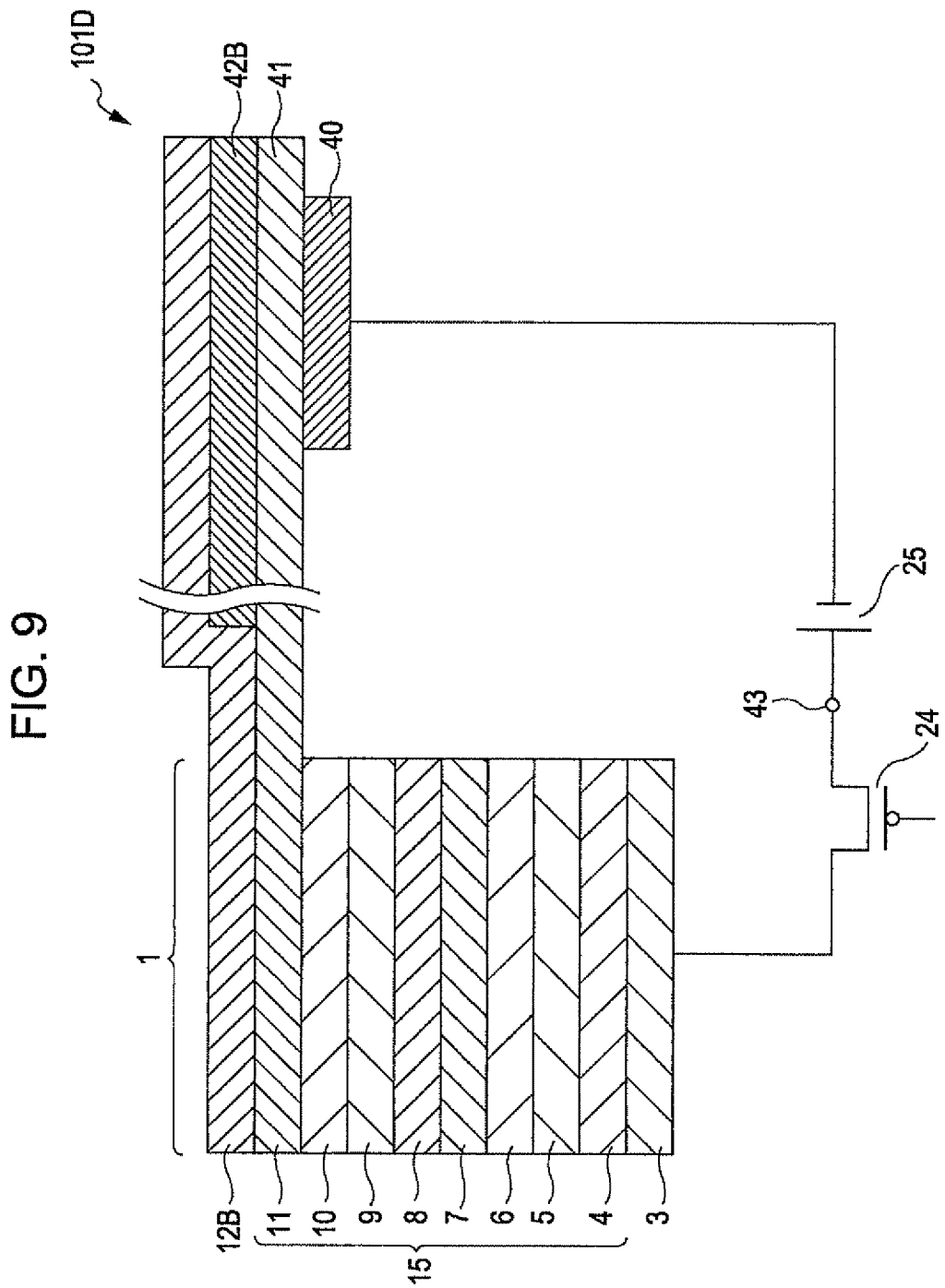
FIG. 9 is a vertical cross-sectional view schematically showing one example of another preferable embodiment of the light-emitting device of the invention.

In FIG. 9, in a light-emitting device 101D, an auxiliary cathode 42B is provided directly on the electron adjust layer 41 at a side opposite to the cathode terminal 40. In addition, a cathode 12B is provided so as to cover the electron adjust layer 41 at a side opposite to the cathode terminal 40 and the auxiliary cathode 42B.

Figure 10:
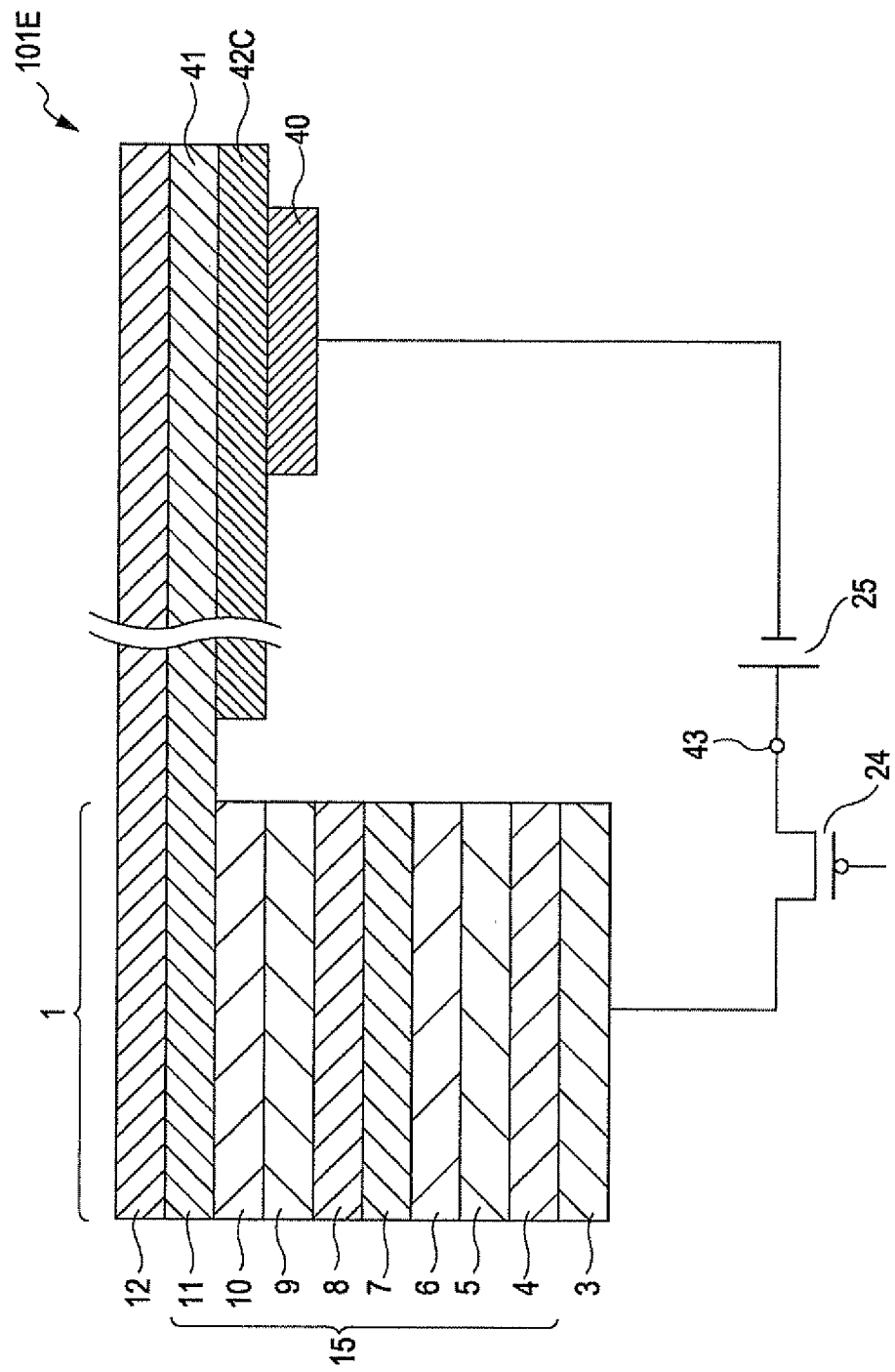
FIG. 10 is a vertical cross-sectional view schematically showing one example of another preferable embodiment of the light-emitting device of the invention.

In FIG. 10, in a light-emitting device 101E, an auxiliary cathode 42C is provided between the electron adjust layer 41 and the cathode terminal 40.

Figure 11:
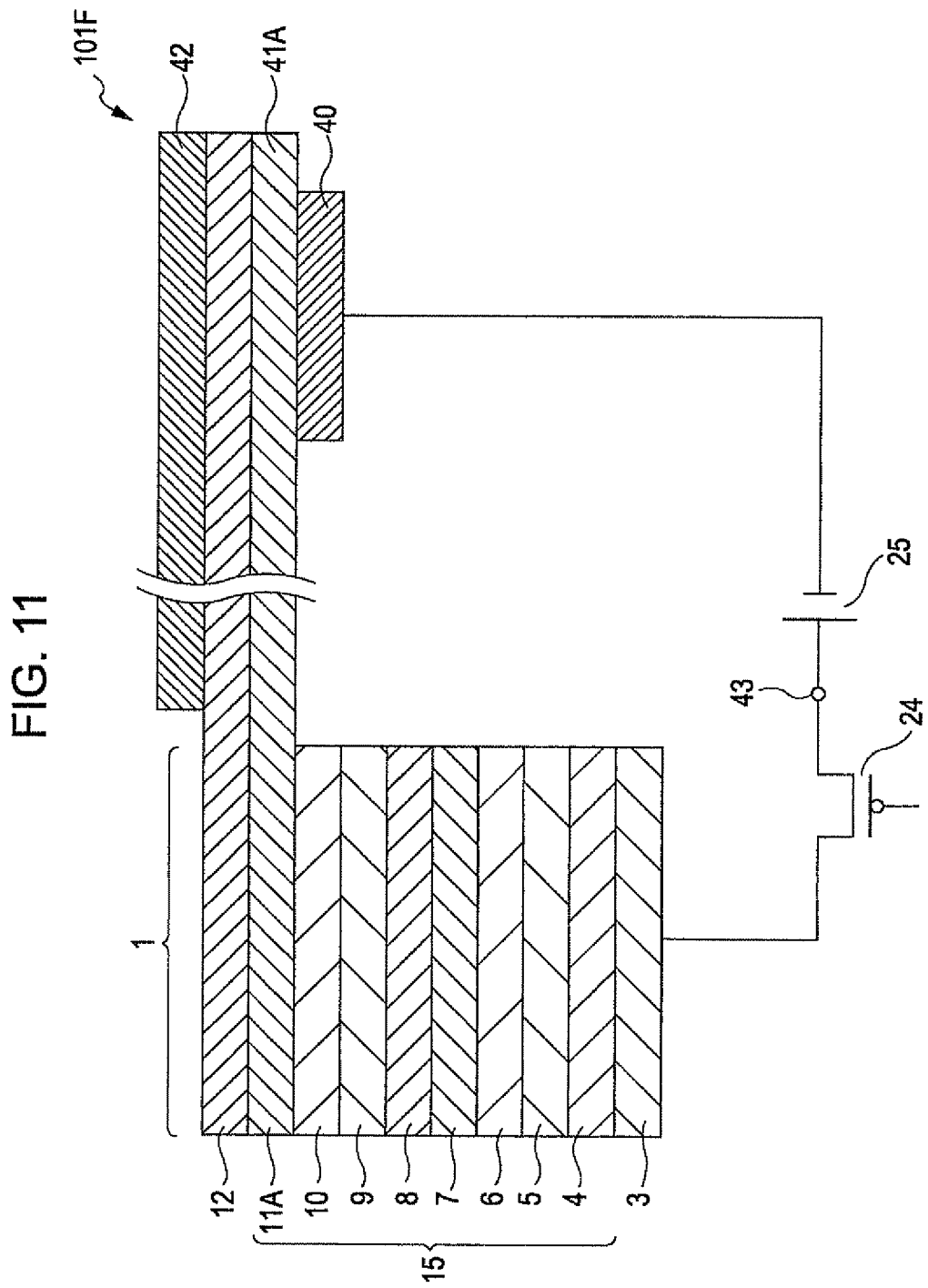
FIG. 11 is a vertical cross-sectional view schematically showing one example of another preferable embodiment of the light-emitting device of the invention.

In FIG. 11, in a light-emitting device 101F, an electron adjust layer 41A and an electron injection layer 11A are not continuously formed. In this case, since the electron adjust layer 41A is a layer different from the electron injection layer 11A, materials suitable for the individual layers may be used.

In the light-emitting devices 101B to 101F, effects similar to those of the light-emitting devices 101 and 101A can be obtained. In addition, in FIGS. 7 to 11, the same elements as those of the light-emitting devices 101 and 101A are designated by the same reference numerals.

In addition, in the above embodiments, the case in which each light-emitting element includes three light-emitting layers has been described; however, for example, the number of light-emitting layers may be one, two, or four or more. In addition, the light-emitting colors of the light-emitting layers are not limited to R, G, and B of the embodiments described above. Even if the number of light-emitting layers is two or four or more, when the light-emitting spectrum of each light-emitting layer is appropriately determined, white light emission can be performed. For example, if the number of light-emitting layers is two, when a blue-light-emitting layer and a yellow-light-emitting layer is used in combination, white light emission can be performed.

In addition, in the embodiments described above, as the light-emitting element, an element emitting white light as a whole has been described; however, the light-emitting element is not limited thereto and, for example, a light-emitting element emitting any color may also be used.

In addition, in the above embodiments, the light-emitting element including the interlayer has been described; however, the light-emitting element is not limited thereto, and the interlayer may be omitted. In addition, whenever necessary, the interlayer may be appropriately provided between the light-emitting layers.

Furthermore, in the above embodiments, the light-emitting element having the structure (top emission type) in which light is taken out of the side opposite to the substrate has been described; however, the light-emitting element is not limited thereto, and the light-emitting element may have the structure (bottom emission type) in which light is taken out of the side of the substrate.

Examples

Next, particular examples of the invention will be described.

A. Manufacturing of Light-Emitting Device

Example

1. First, a transparent glass substrate for a top-emission type having an average thickness of 0.5 mm was prepared on which a switching element, a reflection layer, an (electrolytic corrosion) protection layer, an anode terminal, and other necessary wires were disposed. Next, by a sputtering method, an ITO electrode (anode) having an average thickness of 80 nm was formed on the substrate so as to be connected to the anode terminal.

In addition, after the substrate was sequentially dipped in acetone and 2-propanol in this order and was then ultrasonic-cleaned in pure water, an oxygen plasma treatment was performed.

2. Next, a cathode terminal having an average thickness of 100 nm was formed on the substrate at a position apart from the anode and the anode terminal.

The cathode terminal was formed by a sputtering method.

3. Next, on the ITO electrode, N,N'-bis-(4-diphenylaminophenyl)-N,N'-diphenyl-biphenyl-4,4'-diamine shown by the above chemical formula 1 was deposited by a vacuum evaporation method, so that a hole injection layer having an average thickness of 50 nm was formed.

4. Next, N,N'-bis(1-naphthyl)-N,N'-diphenyl[1,1'-biphenyl]-4,4'-diamine (α-NPD) was deposited on the hole injection layer by a vacuum evaporation method, so that a hole transport layer having an average thickness of 20 nm was formed.

5. Next, a red-light-emitting layer (first light-emitting layer) having an average thickness of 10 nm was formed on the hole transport layer by depositing a constituent material for the red-light-emitting layer using a vacuum evaporation method. As the constituent material for the red-light-emitting layer, a dibenzo-tetraphenyldiindenoperylene derivative shown by the above chemical formula 3 was used as a red-light-emitting material (guest material), and as a host material, a bisphenylyl-tetracene derivative shown by the above chemical formula 5 was used. In addition, the content (dosage) of the light-emitting material (dopant) in the red-light-emitting layer was set to 1.0 percent by weight.

6. Next, a constituent material for an interlayer was supplied on the red-light-emitting layer by a vacuum deposition method, so that an interlayer having an average thickness of 10 nm was formed. As the constituent material for the interlayer, the compound shown by the above chemical formula 2 and the anthracene derivative shown by the above chemical formula 4 were used, and the usage ratio of the materials for the interlayer was set on a weight basis such that the compound shown by the above chemical formula 2 to the anthracene derivative shown by the above chemical formula 4 was 4 to 6.

7. Next, a constituent material for a blue-light-emitting layer was deposited on the interlayer by a vacuum evaporation method, so that a blue-light-emitting layer (second light-emitting layer) having an average thickness of 20 nm was formed. As the constituent material for the blue-light-emitting layer, the distyryldiamine-based compound shown by the above chemical formula 6 was used as a blue-light-emitting material, and as a host material, the anthracene derivative shown by the above chemical formula 4 was used. In addition, the content (dosage) of the blue-light-emitting material (dopant) in the blue-light-emitting layer was set to 10.0 percent by weight.

8. Next, a constituent material for a green-light-emitting layer was deposited on the blue-light-emitting layer by a vacuum evaporation method, so that a green-light-emitting layer (third light-emitting layer) having an average thickness of 10 nm was formed. As the constituent material for the green-light-emitting layer, the quinacridone derivative shown by the above chemical formula 7 was used as a green-light-emitting material (guest material), and as a host material, the anthracene derivative shown by the above chemical formula 4 was used. In addition, the content (dosage) of the green-light-emitting material (dopant) in the green-light-emitting layer was set to 10.0 percent by weight.

9. Next, a film of tris(8-quinolinolato)aluminum ($Alq_3$) shown by the following chemical formula 8 was formed on the green-light-emitting layer by a vacuum evaporation method, so that an electron transport layer having an average thickness of 10 nm was formed.

10. Next, a film of lithium fluoride (LiF) was continuously formed on the electron transport layer and the cathode terminal by a vacuum evaporation method, so that an electron adjust layer having an average thickness of 1 nm was formed. In this step, as a part of the electron adjust layer, an electron injection layer was formed on the electron transport layer.

11. Next, a film of MgAg was formed on the electron adjust layer by a vacuum evaporation method, so that a cathode having an average thickness of 10 nm was formed.

12. Next, by a vacuum evaporation method, a film of Al was formed on the cathode from a position overlapped with the cathode terminal to a position in the vicinity of the anode so as not to be overlapped therewith. As a result, an auxiliary cathode of Al having an average thickness of 100 nm was formed.

13. Next, a glass-made protection cover (sealing member) was formed so as to cover the individual layers thus formed, and fixing and sealing were performed by an epoxy resin.

By the steps described above, a light-emitting device as shown in FIG. 1 in which a light-emitting element emitted white light was manufactured.

Comparative Example

In Step 10 of Example described above, the electron adjust layer was not formed, and a film of lithium fluoride (LiF) was formed on the electron transport layer by a vacuum evaporation method, so that an electron injection layer having an average thickness of 1 nm was formed.

In addition, in Step 11 of Example described above, a film of MgAg was continuously formed on the electron injection layer and the cathode terminal by a vacuum evaporation method. Accordingly, a cathode made of MgAg having an average thickness of 10 nm was formed.

Except for the above two points, a light-emitting device was manufactured in a manner similar to that of Example described above.

B. Evaluation

B-1. Evaluation of Black Floating Phenomenon

By using the light-emitting devices of Example and Comparative Example, a voltage of 2.5 V was applied between the cathode terminal and the anode terminal of the light-emitting device (panel) thus formed by using a direct current power source, and the luminance (cd/m$^2$) was measured using a luminance meter. In addition, the above voltage value was set based on the assumption of the value of a current flowing by a minute voltage applied between the cathode terminal and the anode terminal when the switching element stopped the application of voltage therebetween (when black display was performed).

In addition, as well as the above evaluation, the spectrum (luminescence spectrum) of light emitted from each light-emitting element and the chromaticity (x, y) thereof were measured.

According to the result of the light-emitting device of Example, the luminance was 0.004 cd/m$^2$ and the chromaticity (x, y) was (0.59, 0.40). On the other hand, according to the result of the light-emitting device of Comparative Example, the luminance was 0.02 cd/m$^2$ and the chromaticity (x, y) was (0.65, 0.33). Accordingly, when a relatively minute current flowed, compared to the light-emitting device of Comparative Example, the black floating phenomenon was suppressed in the light-emitting device of Example.

When a voltage of 8.0 V was applied, in both Example and Comparative Example, the luminance was 800 cd/m$^2$ and the chromaticity (x, y) was (0.51, 0.25).

In addition, when the panel (light-emitting device) was actually set to be able to perform display at a maximum luminance of 500 cd/m$^2$, a voltage of 13.0 V was required for the entire TFT circuit. In this case, according to the developed panel (light-emitting device of Example), the dark place contrast was 50,000:1. On the other hand, according to the related panel (light-emitting device of Comparative Example), the dark place contrast was 3,000:1.

The entire disclosure of Japanese Patent Application No. 2009-120358, filed May 18, 2009 is expressly incorporated by reference herein.

What is claimed is:

1. A light-emitting device comprising:
    a substrate which has
        a first edge,
        a second edge being opposed to the first edge, and
        a plane portion being arranged between the first edge and the second edge; and
    a plurality of light-emitting elements which are provided above the plane portion of the substrate in a light-emitting region, each of plurality of the light-emitting elements having:
        a cathode;
        an anode;
        at least one light-emitting layer which is provided between the cathode and the anode and which emits light when a voltage is applied between the cathode and the anode;
    a cathode terminal which is electrically coupled between the cathode and a power source applying the voltage, the cathode terminal being provided in a connecting region outside the light-emitting region,
        the cathode terminal having a first portion and a second portion,
        the first portion being provided between the first edge and the light-emitting region when viewed from a vertical direction to the plane portion of the substrate;
        the second portion being provided between the second edge and the light-emitting region when viewed from a vertical direction to the plane portion of the substrate;
    a functional layer which extends from the light-emitting region to the connecting region, the functional layer being provided between the cathode and the cathode terminal in the connecting region and between the light-emitting layer and the cathode in the light-emitting region, the functional layer adjusting an amount of electrons; and
    an auxiliary cathode that is electrically coupled between the cathode and the cathode terminal and is not overlapped with the light-emitting elements,
    the auxiliary cathode having a third portion which is positioned in the connecting region, the third portion overlapping the cathode and the cathode terminal when viewed from a vertical direction to the plane portion of the substrate,
        the functional layer contacting at least a part of the cathode and the auxiliary cathode,
    an average thickness of the functional layer being 0.2 nm to 10 nm.

2. The light-emitting device according to claim 1,
wherein the cathode terminal and the functional layer are at least partially overlapped with each other in a thickness direction of the functional layer.

3. The light-emitting device according to claim 1,
the auxiliary cathode including a material having a higher electrical conductivity than that of the cathode.

4. The light-emitting device according to claim 3,
wherein the auxiliary cathode is disposed in contact with the cathode.

5. The light-emitting device according to claim 1,
further comprising:
an electron injection layer which is provided between the cathode and the light-emitting layer to be overlapped with at least part of the cathode and at least part of the light-emitting layer in a thickness direction of the cathode,
wherein the electron injection layer and the functional layer includes the same material.

6. The light-emitting device according to claim 5,
wherein the functional layer is provided to be overlapped in a thickness direction thereof with the light-emitting layer and also functions as the electron injection layer of the light-emitting device.

7. The light-emitting device according to claim 1,
further comprising:
a switching element which controls an electrical connection between a power source and the anode,
wherein when the switching element is operated to cut off the electrical connection, the functional layer has certain insulating properties so as to prevent movement of electrons from the cathode terminal to the cathode.

8. The light-emitting device according to claim 1,
further comprising:
a switching element which controls an electrical connection between a power source and the anode,
wherein when the switching element is operated to connect the electrical connection, the functional layer has certain insulating properties so as not to prevent movement of electrons from the cathode terminal to the cathode.

9. The light-emitting device according to claim 1,
wherein the functional layer includes at least one of a ferroelectric material, an alkali metal oxide, an alkali metal halide, an alkaline earth metal oxide, and an alkaline earth metal halide.

10. The light-emitting device according to claim 1,
wherein the functional layer includes a lithium compound.

11. The light-emitting device according to claim 1,
wherein the light-emitting layers are provided between the cathode and the anode.

12. The light-emitting device according to claim 1,
wherein the light-emitting layers emit different colors from each other.

13. A method for manufacturing a light-emitting device comprising:
    forming an anode and a cathode terminal above a substrate, the cathode terminal being provided in a connecting region;
    forming an auxiliary cathode above the cathode terminal;
    forming a light-emitting layer above the anode which emits light when a voltage is applied;
        wherein the cathode terminal and the auxiliary cathode are formed in an area which does not overlap the light-emitting layer;
    forming a functional layer which includes a material having insulating properties and which overlaps the light-emitting layer and the auxiliary cathode in plan view; and
    forming a cathode above an electron adjust layer,
        wherein the cathode terminal is electrically coupled between the cathode and a power source applying the voltage,
        wherein the auxiliary cathode is electrically coupled between the cathode and the cathode terminal,
        wherein the functional layer contacts at least a part of the cathode and the auxiliary cathode, and
        wherein the functional layer is formed with an average thickness of 0.2 nm to 10 nm.

14. A display device comprising the light-emitting device according to claim 1.

15. An electronic apparatus comprising the display device according to claim 14.

16. The light-emitting device according to claim 1, further comprising:
    the functional layer being provided between the auxiliary cathode and the cathode terminal.

* * * * *